United States Patent
Harada et al.

(10) Patent No.: US 10,134,928 B2
(45) Date of Patent: Nov. 20, 2018

(54) PHOTOELECTRIC CONVERSION ELEMENT AND SOLAR CELL MODULE PROVIDED WITH SAME

(71) Applicant: SHARP KABUSHIKI KAISHA, Sakai, Osaka (JP)

(72) Inventors: Masatomi Harada, Sakai (JP); Takeshi Kamikawa, Sakai (JP); Kazuya Tsujino, Sakai (JP); Naoki Koide, Sakai (JP); Naoki Asano, Sakai (JP); Yuta Matsumoto, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 26 days.

(21) Appl. No.: 15/116,926

(22) PCT Filed: Jan. 20, 2015

(86) PCT No.: PCT/JP2015/051322
§ 371 (c)(1),
(2) Date: Aug. 5, 2016

(87) PCT Pub. No.: WO2015/118935
PCT Pub. Date: Aug. 13, 2015

(65) Prior Publication Data
US 2017/0170342 A1    Jun. 15, 2017

(30) Foreign Application Priority Data
Feb. 10, 2014    (JP) .................................. 2014-023731

(51) Int. Cl.
*H01L 31/0236* (2006.01)
*H01L 31/0216* (2014.01)
(Continued)

(52) U.S. Cl.
CPC .. *H01L 31/02363* (2013.01); *H01L 31/02168* (2013.01); *H01L 31/022441* (2013.01);
(Continued)

(58) Field of Classification Search
CPC ......... H01L 31/02168; H01L 31/02362; H01L 31/0747; H01L 31/022441;
(Continued)

(56) References Cited

U.S. PATENT DOCUMENTS

| | | | |
|---|---|---|---|
| 6,184,456 B1 * | 2/2001 | Matsuyama | ........ H01L 31/0368 136/256 |
| 2013/0180585 A1 * | 7/2013 | Goto | ............... H01L 31/022441 136/256 |

FOREIGN PATENT DOCUMENTS

| | | | |
|---|---|---|---|
| JP | WO 2012014983 A1 * | 2/2012 | ..... H01L 31/022441 |
| JP | 2012-195453 | 10/2012 | |

OTHER PUBLICATIONS

International Search Report for PCT/JP2015/051322 dated Apr. 7, 2015, 2 pages.

* cited by examiner

*Primary Examiner* — Magali P Slawski
*Assistant Examiner* — Kourtney R S Carlson
(74) *Attorney, Agent, or Firm* — ScienBiziP, P.C.

(57) ABSTRACT

There is provided a photoelectric conversion element which includes an n-type single crystal silicon substrate (1). The n-type single crystal silicon substrate (1) includes a central region (11) and an end-portion region (12). The central region (11) is a region which has the same central point as the central point of the n-type single crystal silicon substrate (1) and is surrounded by a circle. The diameter of the circle is set to be a length which is 40% of a length of the shortest side among four sides of the n-type single crystal silicon substrate (1). The central region (11) has a thickness t1. The
(Continued)

end-portion region (12) is a region of being within 5 mm from an edge of the n-type single crystal silicon substrate (1). The end-portion region (12) is disposed on an outside of the central region (11) in an in-plane direction of the n-type single crystal silicon substrate (1), and has a thickness t2 which is thinner than the thickness t1. The end-portion region (12) has average surface roughness which is smaller than average surface roughness of the central region (11).

7 Claims, 25 Drawing Sheets

(51) Int. Cl.
*H01L 31/0747* (2012.01)
*H01L 31/0224* (2006.01)
*H01L 31/0352* (2006.01)
*H01L 31/05* (2014.01)
*H01L 31/18* (2006.01)
*H01L 31/20* (2006.01)

(52) U.S. Cl.
CPC .. *H01L 31/035281* (2013.01); *H01L 31/0508* (2013.01); *H01L 31/0516* (2013.01); *H01L 31/0747* (2013.01); *H01L 31/1804* (2013.01); *H01L 31/202* (2013.01); *Y02E 10/547* (2013.01); *Y02P 70/521* (2015.11)

(58) Field of Classification Search
CPC ............ H01L 31/02363; H01L 31/202; H01L 31/0508; H01L 31/0516; H01L 31/1804; H01L 31/035281
USPC ................................. 136/242–265
See application file for complete search history.

| 0.0% | 0.3% | 0.1% | 0.4% | 0.5% | 0.7% | 0.6% | 0.0% |
|------|------|------|------|------|------|------|------|
| 0.3% | 0.4% | 0.4% | 0.3% | 0.5% | 1.1% | 1.2% | 0.6% |
| 0.1% | 0.3% | 0.1% | 0.3% | 0.3% | 0.9% | 1.0% | 0.5% |
| 0.3% | 0.3% | 0.0% | 0.1% | 0.0% | 0.2% | 0.3% | 0.6% |

(a)          (b)

FIG. 18
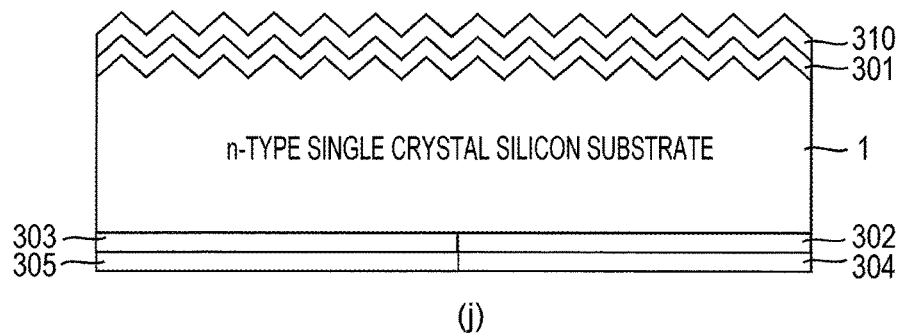
(j)
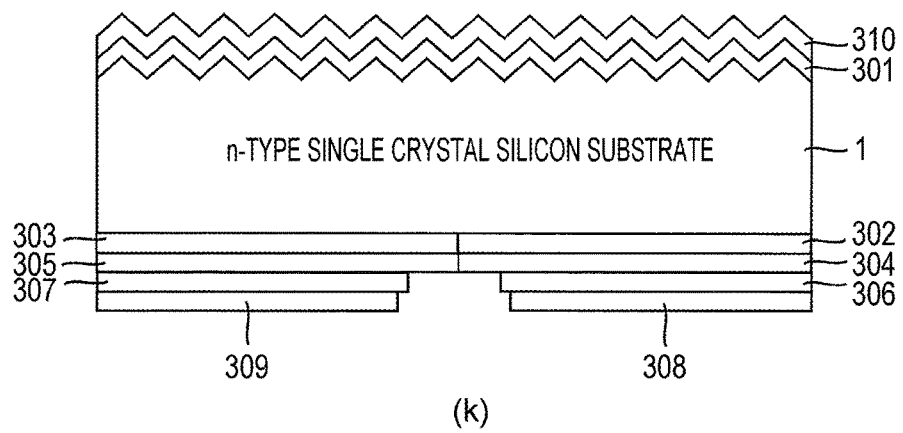
(k)
FIG. 19
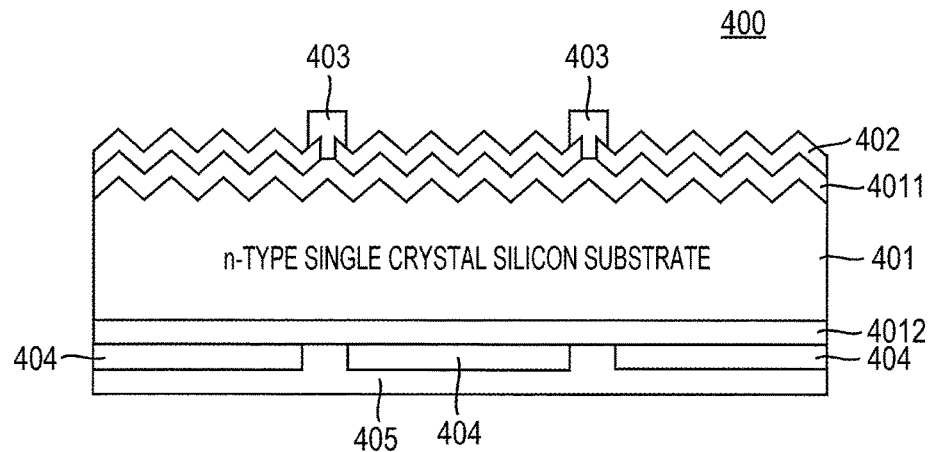

FIG. 22
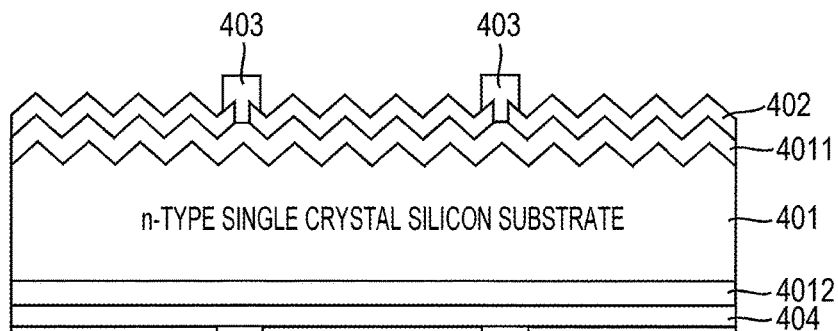
(j)
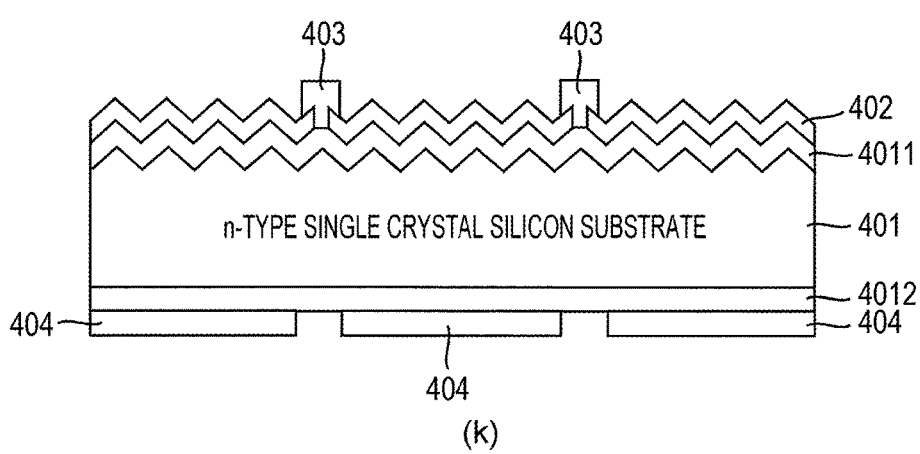
(k)
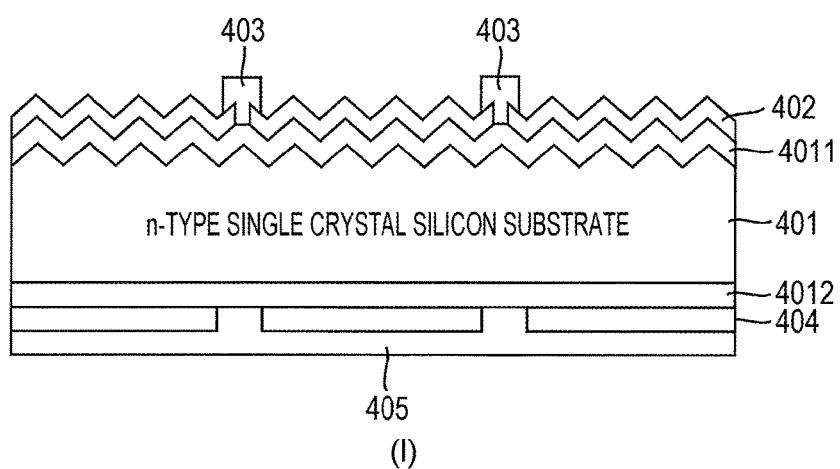
(l)

FIG. 26
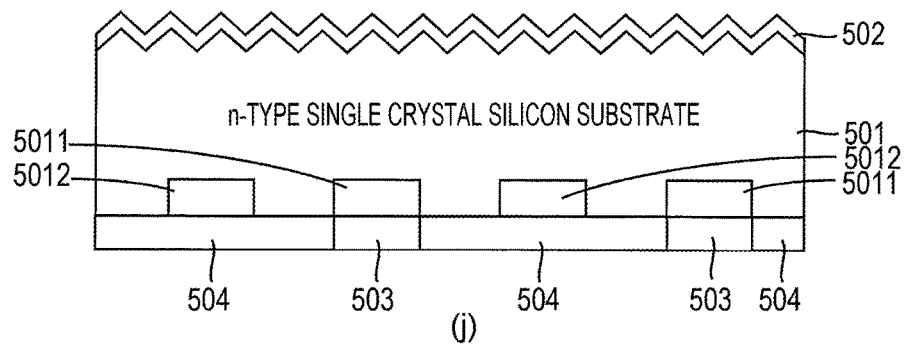
(j)
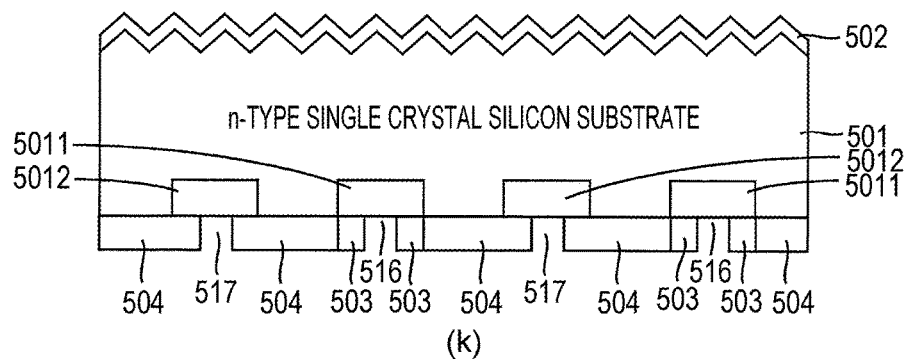
(k)
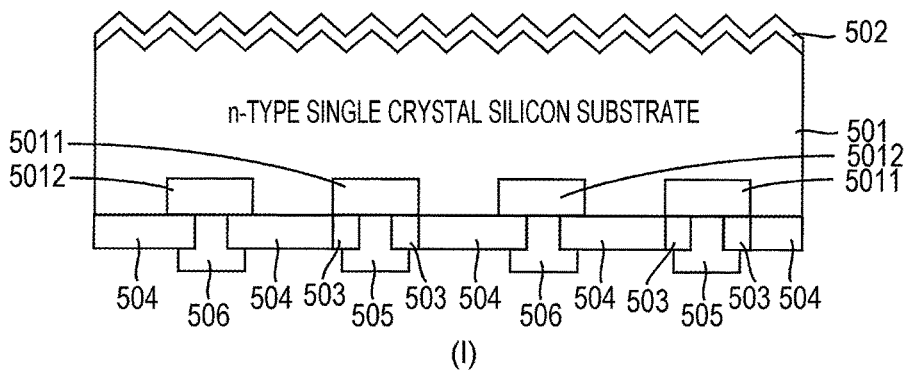
(l)

PHOTOELECTRIC CONVERSION ELEMENT AND SOLAR CELL MODULE PROVIDED WITH SAME

This application is the U.S. national phase of International Application No. PCT/JP2015/051322 filed 20 Jan. 2015 which designated the U.S. and claims priority to JP Patent Application No. 2014-023731 filed 10 Feb. 2014, the entire contents of each of which are hereby incorporated by reference.

TECHNICAL FIELD

The present invention relates to a photoelectric conversion element and a solar cell module provided with the same.

BACKGROUND ART

Recently, development of a solar cell using a single crystal silicon substrate actively proceeds.

In the related art, it has been known that a light-receiving surface of a solar cell using a single crystal silicon substrate has an optical confinement structure in which a front surface of the silicon substrate having the (100) plane is subjected to anisotropic etching, and thus a pyramid-like uneven shape is formed by the (111) surface. In such an optical confinement structure, because the pyramid-like uneven shape causes reflectivity of the front surface of the silicon substrate to be reduced, a short-circuit current can be increased.

A solar cell in which the front surface has the unevenness structure has diffusion type pn junction or hetero-junction type pn junction. In the diffusion type pn junction, conductive impurities are diffused in a silicon substrate. In the hetero-junction type pn junction, an amorphous silicon layer is formed on the front surface of a silicon substrate. As an electrode shape, a type in which electrodes are disposed on the front surface and the back surface of a silicon substrate, and a type in which electrodes are disposed only on the back surface of the silicon substrate are provided.

PTL 1: Japanese Unexamined Patent Application Publication No. 2012-195453

DISCLOSURE OF INVENTION

A substrate for a crystal silicon solar cell is cut off so as to have a predetermined shape or a predetermined size, and thus a desired solar cell module is manufactured. As a cutter of the substrate, a dicer or a device using a laser beam as described in PTL 1 is exemplified.

However, in a case of using a dicer, heat or stress occurring by a cutting tool causes damage to occur in an end surface of a substrate and thus a generation-recombination center of a carrier is formed. Thus, electrical leakage may occur at a portion of the pn junction. Also in a case of using a laser beam, heat of the laser beam causes damage to occur in an end surface of a substrate, and thus a generation-recombination center of a carrier is formed. Thus, a lifetime of carries which have been optically excited by the sun light may be reduced, and performance of a solar cell in a region of the end portion of the substrate may be reduced.

FIG. 35 is a schematic diagram illustrating a solar battery cell. FIG. 35 is a sectional view illustrating a solar cell using an n-type silicon substrate 801. The silicon substrate 801 is configured from a light-receiving surface 802, a non-light-receiving surface 803, and end surfaces 804. Each of the end surfaces 804 receives damage, and thus has a coarse shape. The damage occurs by heat or stress which occurs by the dicer or the cutter using a laser beam. Thus, dangling bonds (uncombined hands) of silicon are increased, and a lifetime of a carrier is significantly reduced.

A current generated in a solar cell substrate is collected at a bus bar through a finger electrode which is disposed on the substrate. If it is considered that one solar cell substrate is divided into minute cells and an equivalent circuit is obtained, it is considered that characteristics of the one solar cell are presented by a parallel circuit of the virtual minute cells. Since the lowest voltage is output as a composite voltage in a parallel circuit, the characteristics of the one solar cell has the lowest open-circuit voltage Voc among the virtual minute cells and the total short-circuit current Jsc of the virtual minute cells.

Accordingly, there is a problem in that an open-circuit voltage Voc of a solar cell having many generation-recombination centers of a carrier on the end surface of a substrate is reduced in accordance with characteristics of a region of the end surface of the substrate.

According to embodiments of the present invention, there is provided a photoelectric conversion element in which in-plane characteristics of an open-circuit voltage can be improved and conversion efficiency can be improved.

According to the embodiments of the present invention, there is provided a solar cell module which includes a photoelectric conversion element in which in-plane characteristics of an open-circuit voltage can be improved and conversion efficiency can be improved.

According to an embodiment of the present invention, there is provided a photoelectric conversion element which includes a silicon substrate. The silicon substrate includes a central region and an end-portion region. The end-portion region is disposed on an outside of the central region in an in-plane direction of the silicon substrate. The thickness of the end-portion region is thinner than the thickness of the central region. Average surface roughness of the end-portion region is smaller than average surface roughness of the central region.

An open-circuit voltage of the photoelectric conversion element is increased as the thickness of the silicon substrate becomes thin, and is increased as the average surface roughness is decreased. As a result, if a silicon substrate in which the thickness of the end-portion region is thinner than the thickness of the central region, the average surface roughness of the end-portion region is smaller than the average surface roughness of the central region is provided, it is possible to reduce variation in in-surface distribution of the open-circuit voltage, and to improve conversion efficiency of the photoelectric conversion element.

Preferably, the photoelectric conversion element further includes a first amorphous semiconductor layer, a second amorphous semiconductor layer, a third amorphous semiconductor layer, and a fourth amorphous semiconductor layer. The first amorphous semiconductor layer is disposed so as to be in contact with one surface of the silicon substrate, and has substantially an i-conductive type. The second amorphous semiconductor layer is disposed so as to be in contact with the first amorphous semiconductor layer and has a first conductive type. The third amorphous semiconductor layer is disposed so as to be in contact with a surface on an opposite side of the one surface of the silicon substrate, and has substantially an i-conductive type. The fourth amorphous semiconductor layer is disposed so as to be in contact with the third amorphous semiconductor layer, and has a second conductive type which is opposite to the first conductive type.

Since both of the light-receiving surface and the back surface of the silicon substrate are interposed between amorphous semiconductor layers which have substantially an i-conductive type, it is possible to improve lifetime of a carrier in the light-receiving surface and the back surface of the silicon substrate. It is possible to reduce thermal strain which is applied to the silicon substrate when the photoelectric conversion element is manufactured, and to suppress a decrease of the lifetime of the carrier in a bulk region of the silicon substrate.

Preferably, the photoelectric conversion element further includes a first amorphous semiconductor layer, a second amorphous semiconductor layer, a third amorphous semiconductor layer, a fourth amorphous semiconductor layer, and a fifth amorphous semiconductor layer. The first amorphous semiconductor layer is disposed so as to be in contact with the light-receiving surface of the silicon substrate. The second amorphous semiconductor layer is disposed so as to be in contact with a surface of the silicon substrate on an opposite side of the light-receiving surface, and has substantially an i-conductive type. The third amorphous semiconductor layer is disposed so as to be contact with the surface of the silicon substrate on the opposite side of the light-receiving surface, is disposed so as to be adjacent to the second amorphous semiconductor layer in the in-plane direction of the silicon substrate, and has substantially an i-conductive type. The fourth amorphous semiconductor layer is disposed so as to be in contact with the second amorphous semiconductor layer and has a conductive type which is opposite to the conductive type of the silicon substrate. The fifth amorphous semiconductor layer is disposed so as to be in contact with the third amorphous semiconductor layer, and has the same conductive type as the conductive type of the silicon substrate.

Since the back surface of the silicon substrate is covered by the amorphous semiconductor layer which has substantially an i-conductive type, it is possible to improve the lifetime of a carrier in the back surface of the silicon substrate. As a result, it is possible to reduce variation in in-surface distribution of the open-circuit voltage in the back-surface junction type photoelectric conversion element which has hetero-junction, and to improve conversion efficiency.

Preferably, the first amorphous semiconductor layer includes a sixth amorphous semiconductor layer and a seventh amorphous semiconductor layer. The sixth amorphous semiconductor layer is disposed so as to be in contact with the light-receiving surface of the silicon substrate, and has substantially an i-conductive type. The seventh amorphous semiconductor layer is disposed so as to be in contact with the sixth amorphous semiconductor layer. The seventh amorphous semiconductor layer which has the same conductive type as the conductive type of the silicon substrate is included.

In the back-surface junction type photoelectric conversion element, the light-receiving surface of the silicon substrate can be passivated by using an amorphous semiconductor layer which has substantially an i-conductive type. As a result, it is possible to improve the lifetime of a carrier in the light-receiving surface of the silicon substrate and to improve conversion efficiency.

Preferably, the photoelectric conversion element further includes an antireflection coat. The antireflection coat is disposed so as to be in contact with the light-receiving surface of the silicon substrate. The silicon substrate includes a first diffusion layer and a second diffusion layer. The first diffusion layer is disposed so as to be in contact with the surface on the opposite side of the light-receiving surface, and has a conductive type which is opposite to the conductive type of the silicon substrate. The second diffusion layer is disposed so as to be in contact with the surface on the opposite side of the light-receiving surface and to be adjacent to the first diffusion layer in the in-plane direction of the silicon substrate, and has the same conductive type as the conductive type of the silicon substrate.

In the back-surface junction type photoelectric conversion element which has homo-junction, it is possible to reduce variation in in-surface distribution of the open-circuit voltage, and to improve conversion efficiency.

Preferably, the photoelectric conversion element further includes an antireflection coat. The antireflection coat is disposed so as to be in contact with the light-receiving surface of the silicon substrate. The silicon substrate includes a first diffusion layer and a second diffusion layer. The first diffusion layer is disposed so as to be in contact with the light-receiving surface of the silicon substrate, and has the same conductive type as the conductive type of the silicon substrate. The second diffusion layer is disposed so as to be in contact with the surface of the silicon substrate on the opposite side of the light-receiving surface, and has a conductive type which is opposite to the conductive type of the silicon substrate.

In the double-sided electrode type photoelectric conversion element which has homo-junction, it is possible to reduce variation in in-surface distribution of the open-circuit voltage, and to improve conversion efficiency.

According to the embodiment of the present invention, there is provided a solar cell module which includes a back sheet, first and second photoelectric conversion elements, interconnect, and a spacer. The first and second photoelectric conversion elements are disposed on the back sheet and are adjacent to each other in an in-plane direction of the back sheet. The interconnect electrically connects the first and second photoelectric conversion elements to each other in series. The spacer is disposed between the back sheet and the first and second photoelectric conversion elements. Each of the first and second photoelectric conversion elements is formed from the photoelectric conversion element according to Claim 2 or Claim 6. The interconnect includes a first connection portion, a second connection portion, and a third connection portion. The first connection portion is disposed between the back sheet and the first photoelectric conversion element, so as to be in contact with an electrode which is provided on an opposite side of the light-receiving surface of the first photoelectric conversion element. The thickness of the first connection portion becomes thicker from the central region of the silicon substrate of the first photoelectric conversion element toward the end-portion region thereof. The second connection portion is disposed so as to be in contact with an electrode which is provided on the light-receiving surface side of the second photoelectric conversion element. The third connection portion is disposed between the first photoelectric conversion element and the second photoelectric conversion element in the in-plane direction of the back sheet. The third connection portion connects the first connection portion and the second connection portion to each other. The spacer is disposed in a region obtained by excluding a region in which the first connection portion of the interconnect is disposed, from a region between the first photoelectric conversion element and the back sheet and between the second photoelectric conversion element and the back sheet. The spacer has a thickness which becomes thicker from the central region of the silicon substrate toward the end-portion region.

The interconnect and the spacer have a thickness as with a thickness of a cross-sectional shape of a silicon substrate in a photoelectric conversion element in which electrodes are respectively disposed on both of the light-receiving surface and the back surface.

Thus, it is possible to horizontally dispose photoelectric conversion elements in which electrodes are respectively disposed on both of the light-receiving surface and the back surface. In addition, it is possible to reduce variation in in-surface distribution of the open-circuit voltage, and to improve conversion efficiency of the solar cell module.

Further, according to the embodiment of the present invention, there is provided a solar cell module which includes a back sheet, first and second photoelectric conversion elements, a first wiring sheet, a second wiring sheet, a third wiring sheet, a fourth wiring sheet, and a contact tab.

The first and second photoelectric conversion elements are disposed on the back sheet, and are adjacent to each other in the in-plane direction of the back sheet. The first wiring sheet is disposed between the back sheet and the first photoelectric conversion element, and is disposed so as to be in contact with any one electrode of a positive electrode and a negative electrode in the first photoelectric conversion element. The second wiring sheet is disposed between the back sheet and the first photoelectric conversion element, and is disposed so as to be in contact with the other electrode of the positive electrode and the negative electrode in the first photoelectric conversion element. The third wiring sheet is disposed between the back sheet and the second photoelectric conversion element, and is disposed so as to be in contact with any one electrode of a positive electrode and a negative electrode in the second photoelectric conversion element. The fourth wiring sheet is disposed between the back sheet and the second photoelectric conversion element, and is disposed so as to be in contact with the other electrode of the positive electrode and the negative electrode in the second photoelectric conversion element. The contact tab is disposed between the first and third wiring sheets, and the back sheet in a region from an end-portion region of the first photoelectric conversion element to an end-portion region of the second photoelectric conversion element in the in-plane direction of the back sheet. The contact tab is disposed so as to be in contact with the first and third wiring sheets. Each of the first and second photoelectric conversion elements is formed from the photoelectric conversion element according to any one of Claims 3 to 5. The thickness of the contact tab is the thickest in a region between the first photoelectric conversion element and the second photoelectric conversion element, and gradually becomes thin toward the central region of the silicon substrate in the first photoelectric conversion element and toward the central region of the silicon substrate in the second photoelectric conversion element.

The contact tab has a cross-sectional shape between the first and second photoelectric conversion elements, and the cross-sectional shape is like a cross-sectional shape of the silicon substrate of the first and second photoelectric conversion elements.

Accordingly, it is possible to horizontally dispose photoelectric conversion elements in which an electrode is disposed on the light-receiving surface. It is possible to reduce variation in in-surface distribution of the open-circuit voltage, and to improve conversion efficiency of the solar cell module.

Preferably, the contact tab includes a resin and a contact electrode. The resin is disposed so as to be in contact with the back sheet. The contact electrode is disposed on the resin so as to be in contact with the second and third wiring sheets.

Since the contact tab includes the resin, it is possible to reduce weight of a solar cell module in comparison to a case where the overall of the contact tab is formed from metal.

According to the embodiments of the present invention, it is possible to reduce variation in in-surface distribution of the open-circuit voltage, and to improve conversion efficiency of a photoelectric conversion element.

BRIEF DESCRIPTION OF DRAWINGS

FIG. 18 is a third process diagram illustrating the manufacturing method of the photoelectric conversion element illustrated in FIG. 14.

FIG. 19 is a sectional view illustrating a configuration of a photoelectric conversion element according to Embodiment 4.

FIG. 22 is a third process diagram illustrating the manufacturing method of the photoelectric conversion element illustrated in FIG. 19.

FIG. 26 is a third process diagram illustrating the manufacturing method of the photoelectric conversion element illustrated in FIG. 23.

BEST MODE FOR CARRYING OUT THE INVENTION

Figure 1:
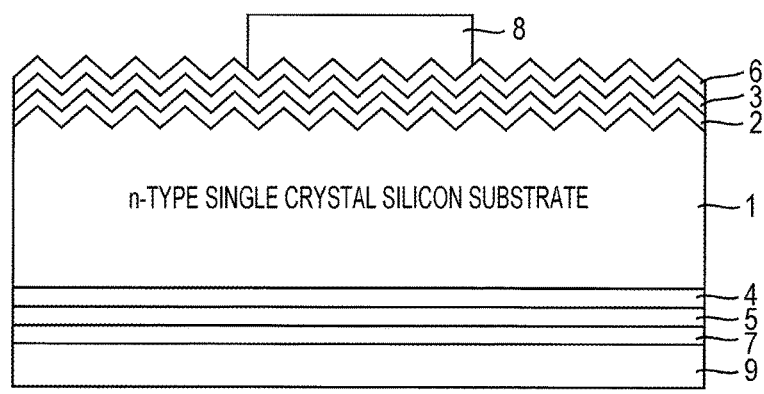
FIG. 1 is a sectional view illustrating a configuration of a photoelectric conversion element according to Embodiment 1 of the present invention.

Embodiments of the present invention will be described in detail with reference to the drawings. The same or corresponding components in the drawings are denoted by the same reference signs and descriptions thereof will not be repeated.

In this specification, amorphous silicon will be described as "a-Si". However, this notation actually means that a hydrogen (H) atom is contained. Regarding amorphous silicon carbide (a-SiC), amorphous silicon oxide (a-SiO), amorphous silicon nitride (a-SiN), amorphous silicon oxide nitride (a-SiON), amorphous silicon germanium (a-SiGe), and amorphous germanium (a-Ge), similarly, the notations also mean that an H atom is contained. An amorphous semiconductor layer is set to include a completely-amorphous semiconductor layer and a microcrystal semiconductor layer. The microcrystal semiconductor layer is referred to a semiconductor in which semiconductor crystal precipitated in the amorphous semiconductor layer has an average particle diameter of 1 nm to 50 nm.

Embodiment 1

FIG. 1 is a sectional view illustrating a configuration of a photoelectric conversion element according to Embodiment 1 of the present invention. With reference to FIG. 1, a photoelectric conversion element 100 according to Embodiment 1 of the present invention includes an n-type single crystal silicon substrate 1, i-type amorphous semiconductor layers 2 and 4, an n-type amorphous semiconductor layer 3, a p-type amorphous semiconductor layer 5, a transparent conductive film 6, a conductive layer 7, and electrodes 8 and 9.

The n-type single crystal silicon substrate 1 has plane orientation of (100) and specific resistance of 0.1 Ω·cm to 30 Ω·cm, for example. The n-type single crystal silicon substrate 1 has a textured surface on a light incoming side. The thickness of the n-type single crystal silicon substrate 1 will be described later in detail.

The i-type amorphous semiconductor layer 2 is formed from an intrinsic amorphous semiconductor. The i-type amorphous semiconductor layer 2 is disposed on the n-type single crystal silicon substrate 1 so as to be in contact with a light-receiving surface (which refers to a surface on which a texture structure is formed and the same applies to the following descriptions) of the n-type single crystal silicon substrate 1. The thickness of the i-type amorphous semiconductor layer 2 is, for example, 0.5 nm to 25 nm.

The n-type amorphous semiconductor layer 3 is formed from an amorphous semiconductor in which n-type impurities are doped. The n-type impurities are phosphorus (P), for example. The n-type amorphous semiconductor layer 3 is disposed on the i-type amorphous semiconductor layer 2 so as to be in contact with the i-type amorphous semiconductor layer 2. The thickness of the n-type amorphous semiconductor layer 3 is, for example, about 2 nm to about 50 nm. P concentration in the n-type amorphous semiconductor layer 3 is, for example, $1 \times 10^{19}$ cm$^{-3}$ to $1 \times 10^{21}$ cm$^{-3}$.

The i-type amorphous semiconductor layer 4 is disposed on the n-type single crystal silicon substrate 1 so as to be in contact with a surface on an opposite side of the light-receiving surface of the n-type single crystal silicon substrate 1. The thickness of the i-type amorphous semiconductor layer 4 is the same as the thickness of the i-type amorphous semiconductor layer 2.

The p-type amorphous semiconductor layer 5 is formed from an amorphous semiconductor in which p-type impurities are doped. The p-type impurities are boron (B), for example. The p-type amorphous semiconductor layer 5 is disposed on the i-type amorphous semiconductor layer 4 so as to be in contact with the i-type amorphous semiconductor layer 4. The thickness of the p-type amorphous semiconductor layer 5 is, for example, about 2 nm to about 50 nm. B concentration in the p-type amorphous semiconductor layer 5 is, for example, $1 \times 10^{19}$ cm$^{-3}$ to $1 \times 10^{21}$ cm$^{-3}$.

The transparent conductive film 6 is disposed on the n-type amorphous semiconductor layer 3 so as to be in contact with the n-type amorphous semiconductor layer 3. The transparent conductive film 6 is formed from, for example, indium tin oxide (ITO), $SnO_2$, ZnO, and the like.

The conductive layer 7 is disposed on the p-type amorphous semiconductor layer 5 so as to be in contact with the p-type amorphous semiconductor layer 5. The conductive layer 7 is formed from a conductive material. An example of the conductive material includes a transparent conductive film and metal such as Ag, Cu, Sn, Pt, Au, Pd, Ti, Ta, Ni, Co, and Al, and alloys containing one or more of the above types of metal, or a multilayer film formed of two types or more of the above metal. The thickness of the conductive layer 7 is, for example, about 70 nm to about 100 nm.

The electrode 8 is disposed on the transparent conductive film 6 so as to be in contact with a portion of the transparent conductive film 6. The electrode 8 is formed from, for example, Ag.

The electrode 9 is disposed on the conductive layer 7 so as to be in contact with the conductive layer 7. The electrode 9 is formed from, for example, Ag.

Figure 2:
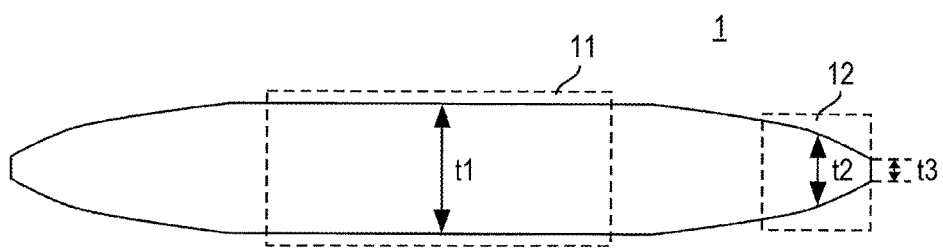
FIG. 2 is a detailed cross-sectional view of an n-type single crystal silicon substrate 1 illustrated in FIG. 1.
Figure 3:
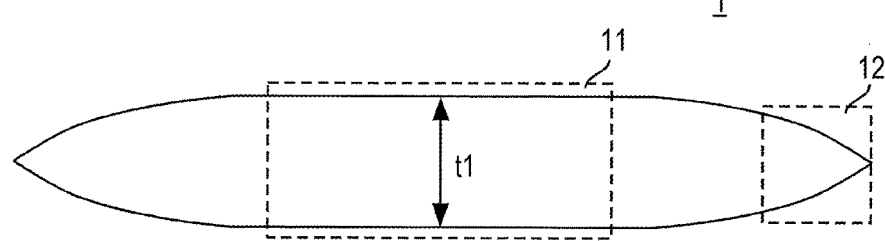
FIG. 3 is a detailed cross-sectional view of the n-type single crystal silicon substrate 1 illustrated in FIG. 1.

FIGS. 2 and 3 are detailed cross-sectional views of the n-type single crystal silicon substrate 1 illustrated in FIG. 1. With reference to FIG. 2, the n-type single crystal silicon substrate 1 includes a central region 11 and an end-portion region 12.

Here, the n-type single crystal silicon substrate 1 is assumed to have a quadrangular shape in which the length of one side is equal to or more than 2.5 cm. The thickness of the n-type single crystal silicon substrate 1 is assumed to be substantially symmetric in a planar direction.

The central region 11 is a region which has a central point which is the same as a central point of the n-type single crystal silicon substrate 1, and is surrounded by a circle. The diameter of the circle is set to be a length which is 40% of a length of the shortest side among four sides of the n-type single crystal silicon substrate 1.

The end-portion region 12 is a region which is within 5 mm from an edge of the n-type single crystal silicon substrate 1. The end-portion region 12 is disposed on an outside of the central region 11 in an in-plane direction of the n-type single crystal silicon substrate 1.

The central region 11 has a thickness t1. The end-portion region 12 has a thickness t2 which is thinner than the thickness t1. The thickness t1 of the central region 11 is defined to be an average value of the thickness of the n-type single crystal silicon substrate 1 in the central region 11. The thickness t2 of the end-portion region 12 is defined to be an average value of the thickness of the n-type single crystal silicon substrate 1 in four sides of the end-portion region 12. The thickness of the n-type single crystal silicon substrate 1 is defined to be a thickness from the back surface of the n-type single crystal silicon substrate 1 to the front surface of the n-type single crystal silicon substrate 1. Similarly, the thickness of the n-type single crystal silicon substrate 1 is also defined in a case where an unevenness structure is formed on the light-receiving surface of the n-type single crystal silicon substrate 1.

The thickness t1 is, for example, 80 μm to 200 μm. The thickness t2 is, for example, 30 μm to 70 μm. Considering durability against brokenness or cracks of the n-type single crystal silicon substrate 1, the thickness t3 of the end surface of the n-type single crystal silicon substrate 1 is, for example, 20 μm to 50 μm.

Regarding the thickness t3 of the end surface of the n-type single crystal silicon substrate 1, t3=0 μm may be satisfied as illustrated in FIG. 3.

As described above, the n-type single crystal silicon substrate 1 has a structure in which the thickness t2 of the end-portion region 12 is thinner than the thickness t1 of the central region 11.

Figure 4:
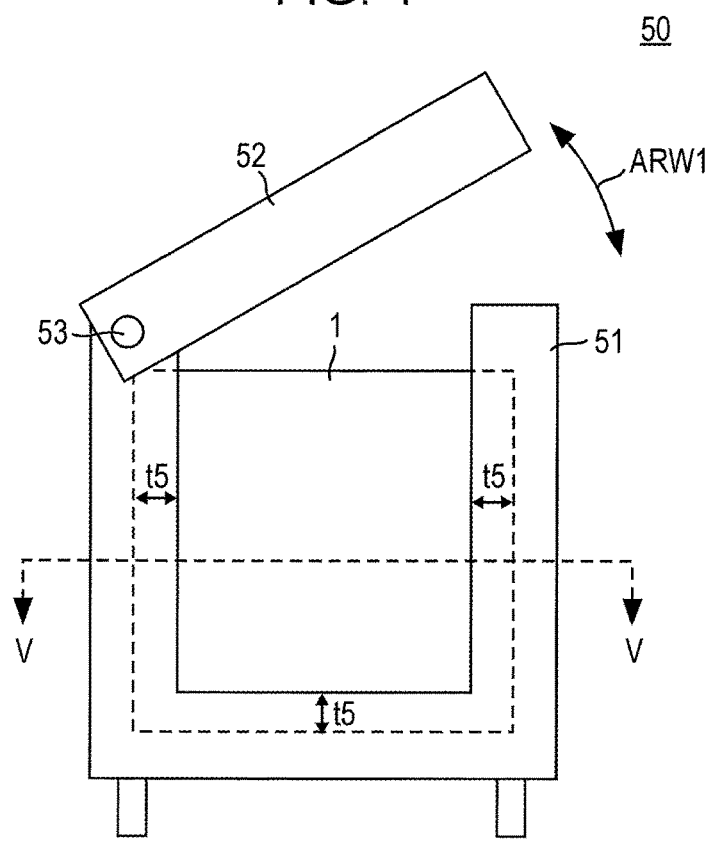
FIG. 4 is a side view of a carrier.
Figure 5:
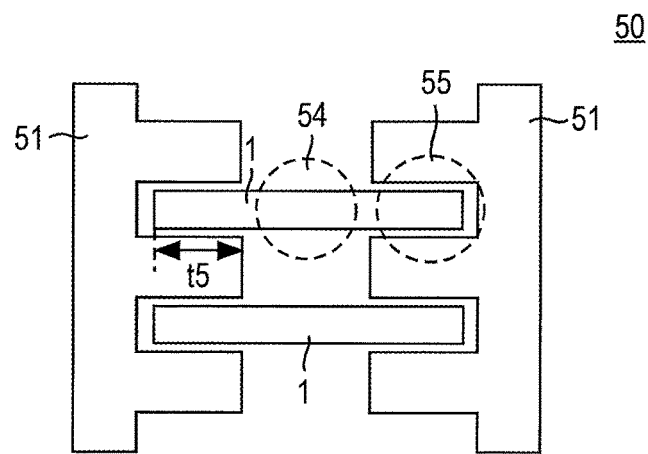
FIG. 5 is a cross-sectional view of the carrier taken along line V-V illustrated in FIG. 4.

FIG. 4 is a side view of a carrier. FIG. 5 is a cross-sectional view of the carrier taken along line V-V illustrated in FIG. 4.

With reference to FIGS. 4 and 5, the carrier 50 includes a main body portion 51, a lid 52, and a screw 53.

The main body portion 51 has a shape which covers a side portion and a bottom portion of the n-type single crystal silicon substrate 1. The lid 52 has one end which is fixed to the main body portion 51 by the screw 53, so as to be rotatable in a direction indicated by an arrow ARW1.

The main body portion 51, the lid 52, and the screw 53 are formed from an acid-resistant resin material and the like. The lid 52 is opened, and the n-type single crystal silicon substrate 1 is disposed in the main body portion 51. If the n-type single crystal silicon substrate 1 is completely disposed in the main body portion 51, the lid 52 is closed. If a width of a portion obtained by overlapping the n-type single crystal silicon substrate 1 and the main body portion 51 or by overlapping the n-type single crystal silicon substrate 1 and the lid 52 is set as t5, the width t5 is set to 10 mm, for example, when the lid 52 is closed. t5 may be appropriately adjusted.

In a case where the n-type single crystal silicon substrate 1 is treated with nitrohydrofluoric acid, the n-type single crystal silicon substrate 1 set in the carrier 50 has a varying liquid circulation velocity of a nitrohydrofluoric acid solution in the surface thereof. Because an opening structure is provided in the region 54, the liquid circulation velocity is high. Because a structure in which a solution easily stays is provided in a region 55, the liquid circulation velocity is low. As a result, an etching rate of the n-type single crystal silicon substrate 1 in the region 55 is higher than that in the region 54.

Accordingly, it is possible to manufacture an n-type single crystal silicon substrate 1 in which the thickness of an end-portion region is thinner than the thickness of a central region, by using the carrier 50.

Figure 6:
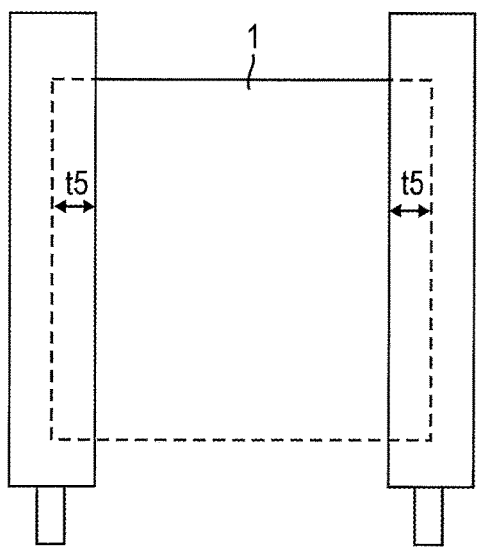
FIG. 6 is a side view of another carrier.

FIG. 6 is a side view of another carrier. The carrier used in Embodiment 1 may be a carrier 50A illustrated in FIG. 6.

With reference to FIG. 6, the carrier 50A has a width t5 of a portion obtained by overlapping the carrier 50A and only a side portion of the n-type single crystal silicon substrate 1. In a case where a silicon substrate is etched by using the carrier 50A, the n-type single crystal silicon substrate is etched first time, and then the n-type single crystal silicon substrate is rotated 90 degrees. The rotated n-type single crystal silicon substrate is put into the carrier 50A. After that, etching is performed again. Thus, it is possible to manufacture an n-type single crystal silicon substrate 1 in which the thickness of an end-portion region is thinner than the thickness of a central region.

(Test 1: Relationship Between Thickness of Silicon Substrate and Open-Circuit Voltage)

An n-type single crystal silicon substrate was obtained by slicing a silicon ingot. The obtained n-type single crystal silicon substrate was thinned by using an alkali solution, and then gettering treatment was performed. Then, the n-type single crystal silicon substrate was etched with a nitrohydrofluoric acid solution, and thus an n-type single crystal silicon substrate having a desired thickness was manufactured. In this test, the thickness of the n-type single crystal silicon substrate was set to be in a range of 80 μm to 170 μm, and the size of the n-type single crystal silicon substrate was set to 125 mm square. A photoelectric conversion element having a structure illustrated in FIG. 1 was manufactured by using the manufactured n-type single crystal silicon substrate. The size of the photoelectric conversion element was 2 cm square, and photoelectric conversion elements which were arranged at the same interval in a 4×4 matrix in the n-type single crystal silicon substrate were manufactured.

Figure 7:
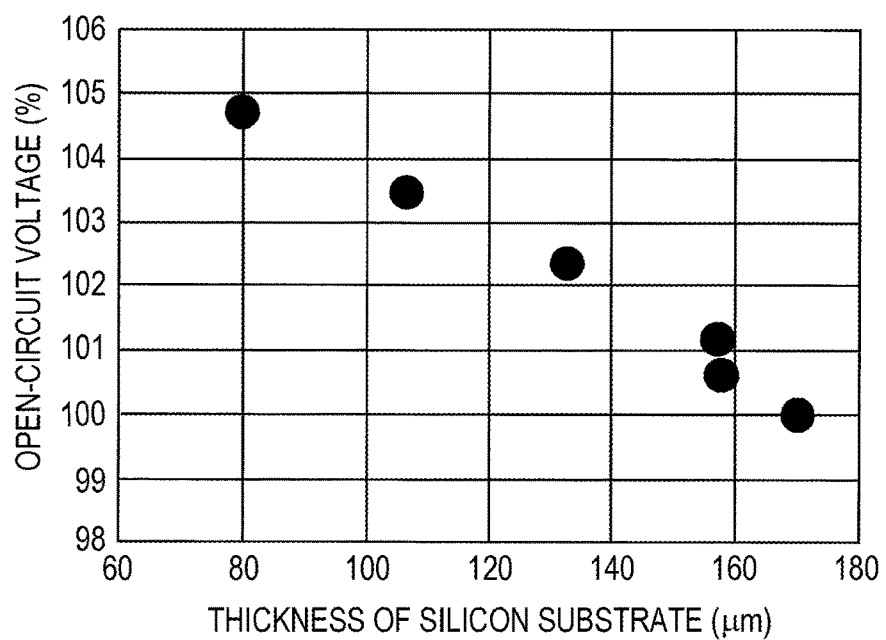
FIG. 7 is a diagram illustrating a relationship between a thickness of a silicon substrate and an open-circuit voltage.

FIG. 7 is a diagram illustrating a relationship between the thickness of a silicon substrate and an open-circuit voltage Voc. In FIG. 7, a vertical axis indicates an open-circuit voltage, and a horizontal axis indicates the thickness of a silicon substrate.

The open-circuit voltage is measured from the photoelectric conversion element which has been formed in the central region of the n-type single crystal silicon substrate. The open-circuit voltage is standardized by an open-circuit voltage when the thickness of a silicon substrate is 170 μm.

With reference to FIG. 7, the open-circuit voltage Voc is improved as the thickness of a silicon substrate becomes thinner.

It is generally known that the open-circuit voltage Voc has a positive correlation with a carrier lifetime τ. Considering this, the test result illustrated in FIG. 7 is considered as follows.

The carrier lifetime of the entirety of a silicon substrate is roughly divided into a carrier lifetime of a bulk region of the silicon substrate and a carrier lifetime of a surface of the silicon substrate, and the smaller carrier lifetime has a large influence on the carrier lifetime of the entirety of the silicon substrate.

Reduction of the thickness of the silicon substrate causes an influence of the bulk region on the entirety of the silicon substrate to be relatively reduced. Thus, a sentence in that the open-circuit voltage Voc is improved by reducing the thickness of the silicon substrate can be interpreted as that the bulk region of the silicon substrate determines the open-circuit voltage Voc.

That is, in the photoelectric conversion element manufactured in Embodiment 1, it is considered that a state where defects such as precipitation of impurities (such as oxygen) and a void, or defects occurring by dopant impurities cause a carrier lifetime of a bulk region in a bulk of the silicon substrate to be reduced, and uncombined hands (such as a dangling bond) of the surface of the silicon substrate is terminated by hydrogen and the like and thus the carrier lifetime is increased is realized.

As described above, it is understood that the carrier lifetime of the surface of the silicon substrate is longer than the carrier lifetime of the bulk region of the silicon substrate, from the test result in that the open-circuit voltage Voc is improved as the thickness of the silicon substrate becomes thin.

(Test 2: Relationship Between Flatness of Substrate and Open-Circuit Voltage)

A silicon ingot was sliced by a wire saw, thereby a silicon substrate was obtained. When slicing was performed, a damage layer was formed on a surface of the silicon substrate. Thus, after the damage layer was removed by using an alkali solution, gettering treatment was performed. Then, an oxide film and an impurity diffusion layer which had been formed in the gettering treatment were removed by using hydrofluoric acid and a nitrohydrofluoric acid solution, and thus an n-type single crystal silicon substrate having a desired thickness was manufactured.

The n-type single crystal silicon substrate was dipped in a nitrohydrofluoric acid solution in which concentrations of hydrofluoric acid and nitric acid were changed, and thus an n-type single crystal silicon substrate having different average surface roughness Ra was manufactured. The average surface roughness Ra is an index obtained by quantifying a degree of unevenness of a surface, which is measured by an atomic force microscope (AFM). The average surface roughness Ra is defined by the following expression.

[Expression 1]

$$Ra = \frac{1}{n}\sum_{i=1}^{n} |Z(i) - Ze| \qquad (1)$$

In the expression (1), Ze indicates an average value of the height in the surface and n indicates the number of measurement points.

Here, the following two types of solutions were used as the nitrohydrofluoric acid solution.

$HF:HNO_3:H_2O$=8.3 weight %:50.0 weight %:41.7 weight %     Solution (A)

$HF:HNO_3:H_2O$=4.5 weight %:54.5 weight %:41.0 weight %     Solution (B)

The average surface roughness Ra before the substrate was dipped into the solutions satisfied Ra=0.75 nm. The average surface roughness Ra caused by the solution (A) satisfied Ra=0.26 nm, and the average surface roughness Ra caused by the solution (B) satisfied Ra=0.34 nm.

In this manner, a method of performing treatment with the solution (A) in which concentration of hydrofluoric acid was high caused the average surface roughness Ra to be reduced.

At this time, the thickness of the n-type single crystal silicon substrate was set to be the same as a thickness thereof after treatment with the solutions (A) and (B) was performed.

The concentrations of the hydrofluoric acid and the nitrohydrofluoric acid are not limited thereto, and can be appropriately set.

A photoelectric conversion element having a structure illustrated in FIG. 1 was manufactured by using the n-type single crystal silicon substrates. The size of the photoelectric conversion element was 2 cm square, and photoelectric conversion elements which were arranged at the same interval in a 4×4 matrix in the n-type single crystal silicon substrate were manufactured.

Figures 8, 9:
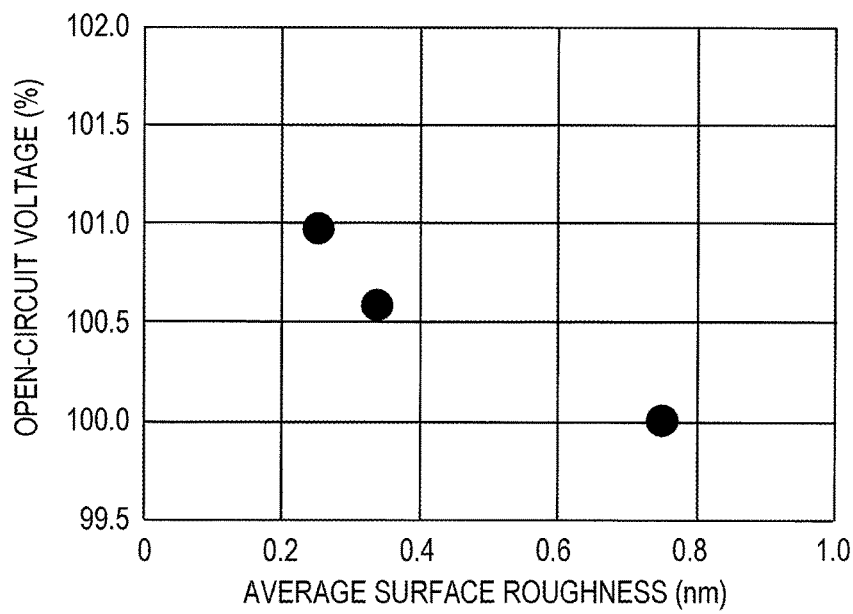
FIG. 8 is a diagram illustrating a relationship between average surface roughness and the open-circuit voltage.
FIG. 9 is a diagram illustrating a fluctuation rate of the open-circuit voltage of each photoelectric conversion element on a substrate.

FIG. 8 is a diagram illustrating a relationship between the average surface roughness and the open-circuit voltage. In FIG. 8, a vertical axis indicates the open-circuit voltage Voc, and a horizontal axis indicates the average surface roughness Ra.

The open-circuit voltage Voc indicates an open-circuit voltage with respect to each average surface roughness Ra when the open-circuit voltage Voc when the average surface roughness Ra is 0.75 nm is set to be "1".

With reference to FIG. 8, the open-circuit voltage Voc is increased as the average surface roughness Ra becomes small.

In the structure of the photoelectric conversion element 100, pn junction is formed between the n-type single crystal silicon substrate 1 and the p-type amorphous semiconductor layer 5. Thus, a shape of the interface therebetween influences the open-circuit voltage Voc.

The following is considered as a cause of such an influence. If unevenness is randomly provided in the front surface of the n-type single crystal silicon substrate 1, stress received in the amorphous silicon layer formed on the front surface causes the amorphous silicon layer to be changed to be a film in which crystallization is partially performed or causes a film thickness of the amorphous silicon layer to be changed. Thus, passivation properties are changed in the surface.

Accordingly, as pn junction is formed at an interface which has small average surface roughness Ra and is flat, the increased open-circuit voltage Voc is obtained.

(Test 3: Relationship Between Substrate Shape and In-Surface Distribution of Open-Circuit Voltage)

The inventors found out the followings from the two tests. In a case where passivation properties on the surface of the silicon substrate are more excellent than passivation properties in the bulk region of the silicon substrate, (1) the silicon substrate is thinned, and (2) the average surface roughness Ra of the surface of the silicon substrate is reduced, and thus it is possible to improve the open-circuit voltage Voc.

Generally, it is considered that passivation properties at an interface between an amorphous semiconductor film (which is obtained by deposition on the surface) and the silicon substrate are worse than passivation properties of silicon-to-silicon bonds in the bulk region of the silicon substrate. Thus, it is considered that thinning the substrate causes excellent passivation properties to be decreased, and thereby performance of the photoelectric conversion element is deteriorated.

However, information of the above-described (1) concluded from the result of (Test 1) overturns the above-described general consideration. The information of the above-described (1) is valid only in a case where high technical skills in which passivation properties on the surface of the silicon substrate are more excellent than passivation properties in the bulk region of the silicon substrate are provided.

Information of the above-described (2) is that the increased open-circuit voltage Voc is obtained as pn junction is formed at a flat interface. In a solar cell for housing and the like, generation of power of about several kW is desired and a large area is required. In terms of production cost or yield, a substrate having a non-mirror surface has been conventionally used as a crystal silicon substrate for a solar cell by using a simple process. In a solar cell in which a non-mirror surface is used as a main member, the information of the above-described (2) is new information.

The two pieces of information are obtained as a result obtained by the inventors promoting a earnest research.

In this test, four sides of the silicon substrate were subjected to laser cutting so as to obtain a substrate (b). Then, a photoelectric conversion element having a structure illustrated in FIG. 1 was manufactured by using a substrate (a) and the substrate (b). The substrate (a) was obtained by thinning the end-portion region and reducing the average surface roughness Ra. The substrate (b) was obtained by cutting four sides of the silicon substrate with laser beams.

A manufacturing method of the substrate (a) is as follows.

A silicon ingot was sliced, thereby a silicon substrate was obtained. The silicon substrate was thinned by using an alkali solution, and then gettering treatment was performed. After that, the silicon substrate was etched with a nitrohydrofluoric acid solution by using the carrier 50 (see FIGS. 4 and 5) or the carrier 50A (see FIG. 6), and thus a silicon substrate in which the central region of the silicon substrate had a thickness of about 150 μm was manufactured.

The thickness of the substrate (a) manufactured in this manner was 160 μm in the central region and 30 μm in the end-portion region. The average surface roughness Ra was 0.68 nm in the central region and 0.26 nm in the end-portion region.

The size of the photoelectric conversion element was 2 cm square, and photoelectric conversion elements which were arranged at the same interval in a 4×4 matrix in the n-type single crystal silicon substrate were manufactured.

FIG. 9 is a diagram illustrating a fluctuation rate of open-circuit voltages of photoelectric conversion elements on each substrate. FIG. 9 illustrates open-circuit voltages Voc in a 4×4 matrix and also illustrates information of a position of each photoelectric conversion element on the substrate. The fluctuation rate of the open-circuit voltages Voc is defined by the following expression.

fluctuation rate (%) of open-circuit voltage=(open-circuit voltages of photoelectric conversion elements/((lowest open-circuit voltage on substrate)−1)×100(%)

FIG. 9(a) illustrates a fluctuation rate of open-circuit voltages Voc in a case of using the substrate (a). FIG. 9(b) illustrates a fluctuation rate of open-circuit voltages Voc in a case of using the substrate (b).

With reference to FIG. 9, in a case of using the substrate (b), in-surface distribution of the open-circuit voltage Voc is large and there is fluctuation of up to 1.2%. In a case of using the substrate (a), in-surface distribution of the open-circuit voltage Voc is suppressed and the fluctuation rate thereof is within 0.4%.

As described above, the end-portion region of the n-type single crystal silicon substrate is thinned and the average surface roughness Ra is reduced, and thus generated power per the n-type single crystal silicon substrate can be improved.

Figure 10:
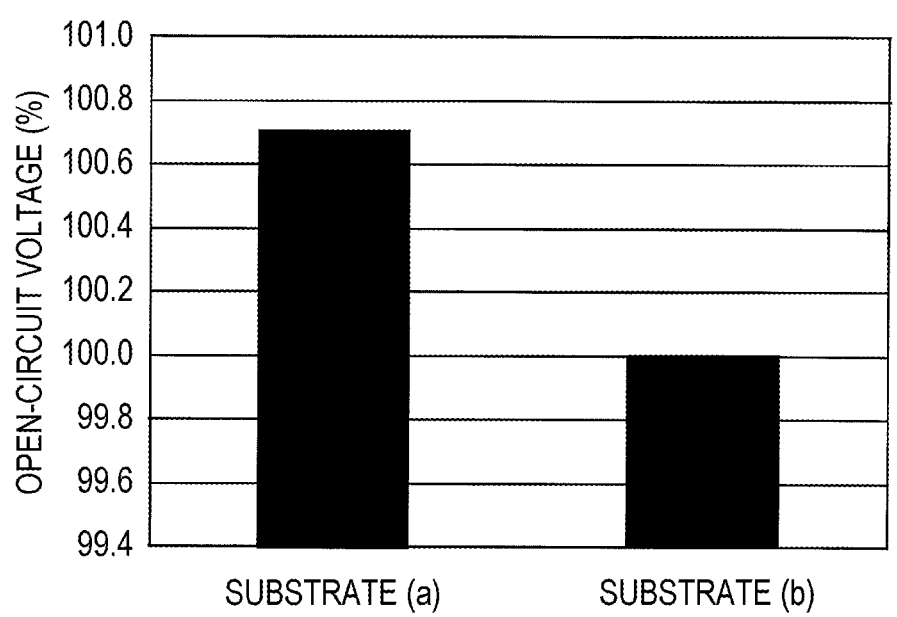
FIG. 10 is a diagram illustrating a result obtained by performing comparison to an open-circuit voltage when photoelectric conversion elements are manufactured over the entirety of an n-type single crystal silicon substrate of 125 mm square.

FIG. 10 is a diagram illustrating a result obtained by performing comparison to an open-circuit voltage Voc when photoelectric conversion elements are manufactured over the entirety of an n-type single crystal silicon substrate of 125 mm square.

In FIG. 10, a vertical axis indicates the open-circuit voltage Voc, and a horizontal axis indicates the type of a substrate. The open-circuit voltage Voc indicates an open-circuit voltage in a case of using the substrates (a) and (b), on the assumption that the open-circuit voltage Voc in a case of using the substrate (b) is "1".

With reference to FIG. 10, the open-circuit voltage Voc in a case of using the substrate (a) is larger than the open-circuit voltage Voc in a case of using the substrate (b). Similar to the test results, it is important that the open-circuit voltage Voc of the end-portion region of the n-type single crystal silicon substrate is not decreased.

This test causes the following to be understood. Even in a photoelectric conversion element having a size of 125 mm square, the thickness of the end-portion region of the n-type single crystal silicon substrate is thinner than the thickness of the central region thereof, and the average surface roughness Ra of the end-portion region of the n-type single crystal silicon substrate is smaller than the average surface roughness Ra of the central region, and thus it is possible to improve the open-circuit voltage Voc. As a result, it is considered that similar effects are obtained even when the substrate size is large.

Figure 11:
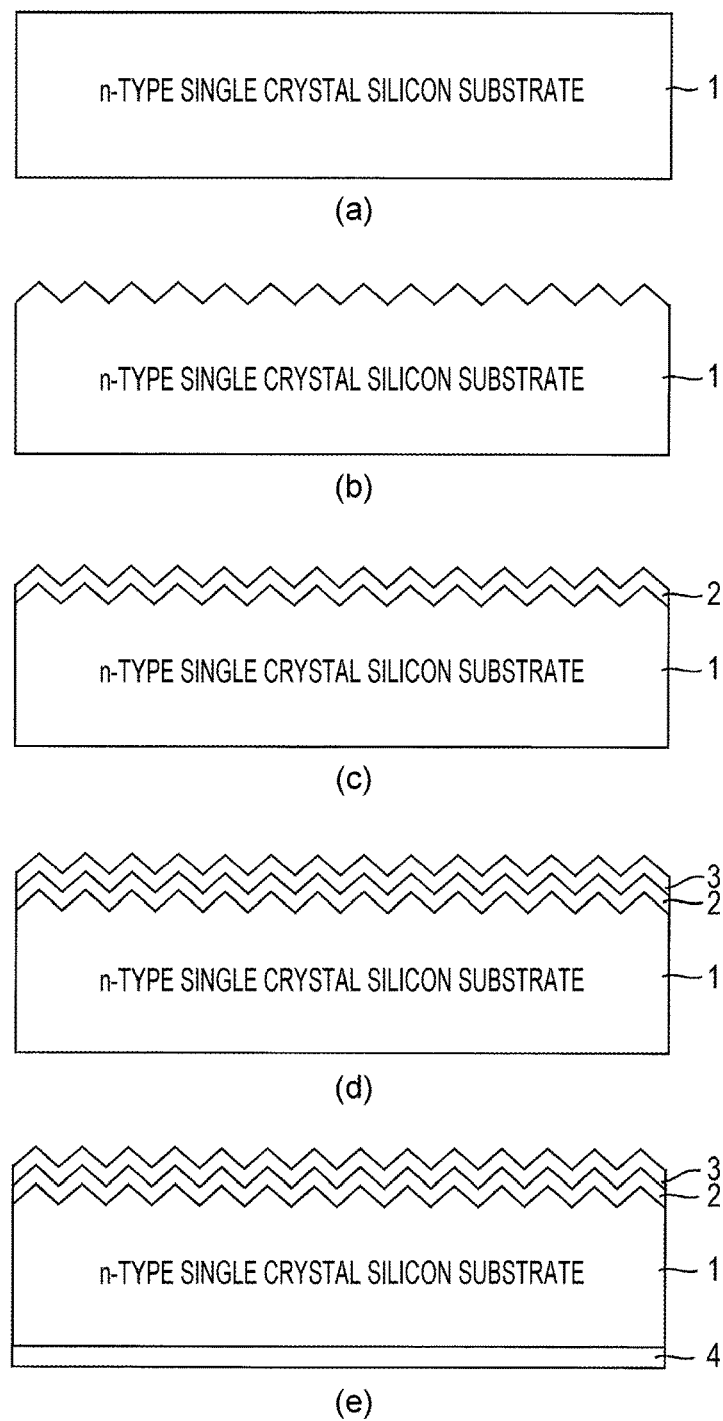
FIG. 11 is a first process diagram illustrating a manufacturing method of the photoelectric conversion element illustrated in FIG. 1.
Figure 12:
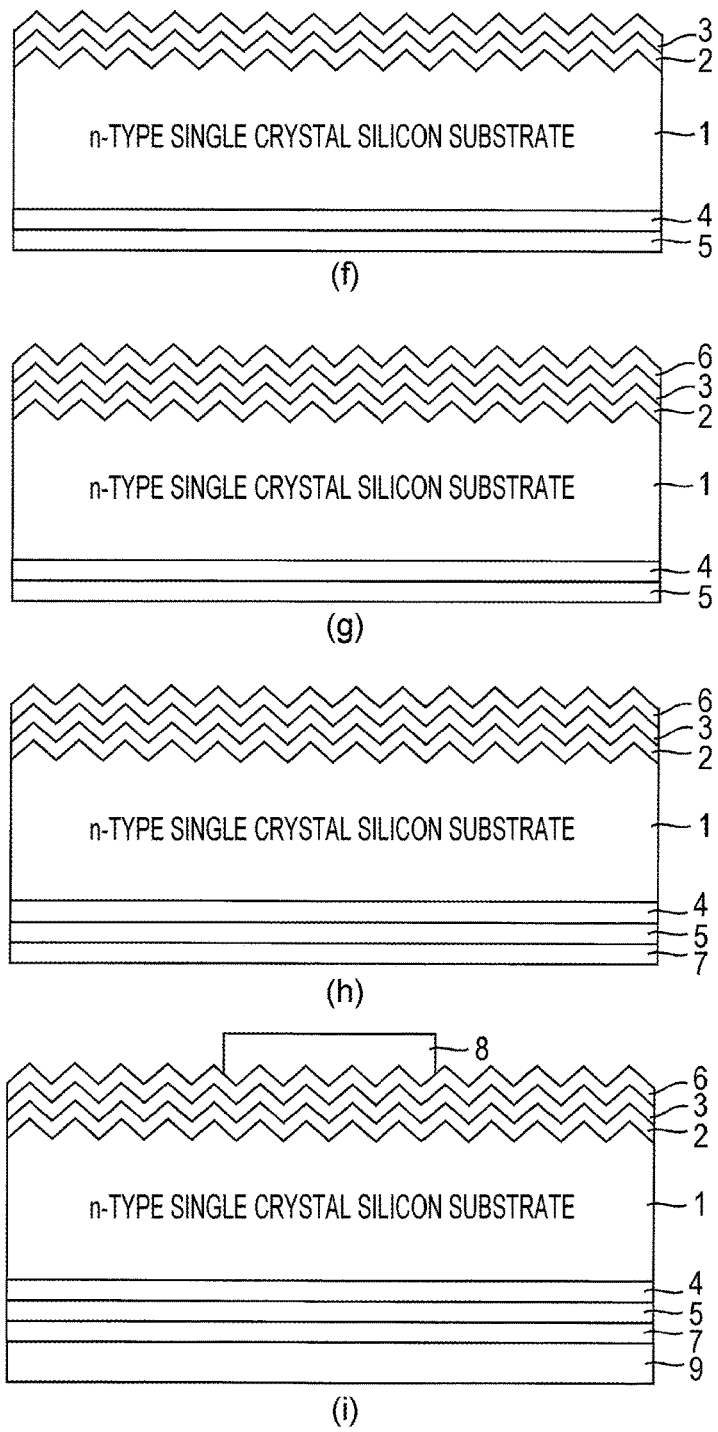
FIG. 12 is a second process diagram illustrating the manufacturing method of the photoelectric conversion element illustrated in FIG. 1.

FIG. 11 is a first process diagram illustrating a manufacturing method of the photoelectric conversion element 100 illustrated in FIG. 1. FIG. 12 is a second process diagram illustrating the manufacturing method of the photoelectric conversion element 100.

A manufacturing method of the photoelectric conversion element 100 will be described. The photoelectric conversion element 100 is manufactured by using a plasma chemical vapour deposition (CVD) method and by mainly using a plasma device.

The plasma device includes a power source, for example. The power source is used for applying RF power of 13.56 MHz to flat electrodes which are parallel to each other, through a matching device.

If manufacturing the photoelectric conversion element 100 is started, a silicon ingot is sliced, thereby a silicon substrate is obtained. The silicon substrate is etched with nitrohydrofluoric acid, and thus an n-type single crystal silicon substrate in which the thickness of the end-portion region is thinner than the thickness of the central region is manufactured. Then, the manufactured n-type single crystal silicon substrate is etched with the above-described solution (A), and thus an n-type single crystal silicon substrate 1 in which the average surface roughness Ra of the end-portion region is smaller than the average surface roughness Ra of the central region is formed (see the process (a) in FIG. 11). The process (a) of FIG. 11 illustrates that the thickness of the n-type single crystal silicon substrate 1 is constant in the central region and the end-portion region. However, actually, the thickness of the n-type single crystal silicon substrate 1 is thinner in the end-portion region than that in the central region.

Then, silicon oxide ($SiO_2$) having a thickness of about 100 nm to 300 nm is formed on one surface of the n-type single crystal silicon substrate 1 by using a sputtering method. The other surface of the n-type single crystal silicon substrate 1 is textured (see the process (b) in FIG. 11) by chemical anisotropic etching for 30 minutes at a temperature of 80° C. to 90° C. The chemical anisotropic etching is performed by using potassium hydroxide (KOH) of 1 weight % to 5 weight %, and isopropyl alcohol (IPA) of 1 weight % to 10 weight %. In this case, the size of the formed pyramid is, for example, about 15 μm.

Then, the n-type single crystal silicon substrate 1 is dipped in hydrofluoric acid, and thus a natural oxide film which has been formed on the surface of the n-type single crystal silicon substrate 1 is removed, and the surface of the n-type single crystal silicon substrate 1 is terminated by using hydrogen.

If washing of the n-type single crystal silicon substrate 1 is ended, the n-type single crystal silicon substrate 1 is put into a reaction chamber of the plasma device.

A silane ($SiH_4$) gas of 200 sccm to 1000 sccm and a hydrogen ($H_2$) gas of 200 sccm to 3000 sccm are caused to flow in the reaction chamber. Pressure of the reaction chamber is set to be from 30 Pa to 500 Pa, and a substrate temperature is set to be from 130° C. to 220° C. If setting as described above is performed, the RF power source applies RF power of 5 mW/cm$^2$ to 40 mW/cm$^2$ to plate electrodes which are parallel to each other, through the matching device. Thus, plasma is generated in the reaction chamber and an i-type amorphous semiconductor layer 2 formed from i-type a-Si is deposited on the light-receiving surface (=surface on which a texture structure is formed) of the n-type single crystal silicon substrate 1 (see the process (c) in FIG. 11).

If the film thickness of the i-type amorphous semiconductor layer 2 is from 0.5 nm to 25 nm, applying RF power is stopped, and a phosphine ($PH_3$) gas of 30 sccm to 500 sccm, which has been diluted with hydrogen is caused to flow in the reaction chamber. The pressure of the reaction chamber is set to be from 20 Pa to 100 Pa, and the RF power source applies RF power of 5 mW/cm$^2$ to 40 mW/cm$^2$ to the plate electrodes which are parallel to each other, through the matching device. Thus, an n-type amorphous semiconductor layer 3 formed from n-type a-Si is deposited on the i-type amorphous semiconductor layer 2 (see the process (d) in FIG. 11). The concentration of the $PH_3$ gas which has been diluted with hydrogen is, for example, 1%.

Then, the n-type amorphous semiconductor layer 3/i-type amorphous semiconductor layer 2/n-type single crystal silicon substrate 1 are extracted from the plasma device, and the n-type amorphous semiconductor layer 3/i-type amorphous semiconductor layer 2/n-type single crystal silicon substrate 1 is put into the plasma device so as to enable deposition of a thin film on the back surface (surface on an opposite side of the surface on which the n-type amorphous semiconductor layer 3/i-type amorphous semiconductor layer 2 have been formed) of the n-type single crystal silicon substrate 1.

The i-type amorphous semiconductor layer 4 is formed on the back surface of the n-type single crystal silicon substrate 1 by using forming conditions which are the same as those for the i-type amorphous semiconductor layer 2 (see the process (e) in FIG. 11).

The i-type amorphous semiconductor layer 4 may be formed by using the forming conditions which are different from the forming conditions for the i-type amorphous semiconductor layer 2.

Then, a $SiH_4$ gas of 200 sccm to 1000 sccm, a $H_2$ gas of 200 sccm to 3000 sccm, and a diborane ($B_2H_6$) gas of 30 sccm to 500 sccm, which has been diluted with hydrogen is caused to flow in the reaction chamber. The pressure of the reaction chamber is set to be from 20 Pa to 100 Pa, and the RF power source applies RF power of 5 mW/cm$^2$ to 40 mW/cm$^2$ to the plate electrodes which are parallel to each other, through the matching device. Thus, a p-type amorphous semiconductor layer 5 formed from p-type a-Si is deposited on the i-type amorphous semiconductor layer 4 (see the process (f) in FIG. 12). The concentration of the $B_2H_6$ gas which has been diluted with hydrogen is, for example, 2%.

Then, a transparent conductive film (=ITO) 6 is formed on the n-type amorphous semiconductor layer 2, for example, by using a sputtering method (see the process (g) in FIG. 12). In this case, a sintered body of $In_2O_3$ powder with which $SnO_2$ powder of 5 weight % is mixed is installed as a target on the cathode. The n-type single crystal silicon substrate 1 is disposed so as to be parallel to the cathode in which the i-type amorphous semiconductor layer 2 and the like have been formed. Vacuum evacuation is performed on the chamber. Then, the n-type single crystal silicon substrate 1 is heated so as to cause the temperature of the n-type single crystal silicon substrate 1 to be 180° C. A gas mixture of an argon (Ar) gas of 200 sccm to 800 sccm and an oxygen ($O_2$) gas of 0 sccm to 30 sccm is caused to flow in the chamber. While the pressure of the chamber is held to be from 0.4 Pa to 1.3 Pa, power of 0.2 kW to 2 kW is supplied and discharged. Thus, the transparent conductive film (=ITO) 6 is formed.

Then, the conductive layer (ITO) 7 is formed on the p-type amorphous semiconductor layer 5 by using forming conditions which are the same as those for the transparent conductive film (=ITO) 6 (see the process (h) in FIG. 12).

The transparent conductive film 6 and the conductive layer 7 may be formed by using a thin film forming method (such as a CVD method and a vapor deposition method), a plating method, or a combination thereof, in addition to the sputtering method.

Ag paste obtained by kneading Ag fine powder in an epoxy resin is formed by screen printing, so as to have a height of about 10 μm to 30 μm, and a width of 100 μm to 500 μm. The formed Ag paste is fired and cured for 80 minutes at 200° C., and thus comb-like electrodes 8 and 9 are formed (see the process (i) in FIG. 12). Accordingly, a photoelectric conversion element 100 is completed.

If incident light is incident from the transparent conductive film 6 side to the photoelectric conversion element 100, electrons and holes in the n-type single crystal silicon substrate 1 are photoexcited. The photoexcited electrons and holes are electrically separated by pn junction (n-type single crystal silicon substrate 1/p-type amorphous semiconductor layer 5). The electrons reach the electrode 8 through the i-type amorphous semiconductor layer 2, the n-type amorphous semiconductor layer 3, and the transparent conductive film 6. The holes reach the electrode 9 through the i-type amorphous semiconductor layer 4, the p-type amorphous semiconductor layer 5, and the conductive layer 7.

The electron which has reached the electrode 8 reaches the electrode 9 through a load which is connected between the electrode 8 and the electrode 9, and is recombined with the hole. Thus, power generated by the photoelectric conversion element 100 is supplied to the load.

The photoelectric conversion element 100 includes the n-type single crystal silicon substrate 1 in which the thickness of the end-portion region is thinner than the thickness of the central region, and the average surface roughness of the end-portion region is smaller than the average surface roughness of the central region. The open-circuit voltage is increased as the thickness of the n-type single crystal silicon substrate 1 becomes thin, and is increased as the average surface roughness becomes small. Thus, it is possible to reduce in-surface variation of the open-circuit voltage, and to improve conversion efficiency.

In the photoelectric conversion element 100, the conductive layer 7 is disposed between the p-type amorphous semiconductor layer 5 and the electrode 9. Thus, it is possible to suppress recombination of carriers at an interface between the p-type amorphous semiconductor layer 5 and the electrode 9. In a case where the conductive layer 7 is formed from a transparent conductive film, and the electrode 9 is formed from Ag, light transmitting the n-type single crystal silicon substrate 1 is reflected at an interface between the conductive layer 7 (transparent conductive film) and the electrode (Ag) 9 and is absorbed in the n-type single crystal silicon substrate 1. Accordingly, it is possible to improve a short-circuit current of the photoelectric conversion element 100.

In the above descriptions, an example in which the i-type amorphous semiconductor layer 2 is formed from i-type a-Si is described. However, in Embodiment 1, it is not limited thereto. The i-type amorphous semiconductor layer 2 may be formed from any of i-type a-SiC, i-type a-SiN, i-type a-SiO, i-type a-SiON, i-type a-SiGe, and i-type a-Ge. The i-type amorphous semiconductor layer 2 may contain dopants of, for example, P and B of which concentration is equal to or less than $1 \times 10^{16}$ cm$^{-3}$. This is because P, B, and the like which have adhered to a wall of the reaction chamber may be added in the i-type amorphous semiconductor layer 2 in a case where the photoelectric conversion element 100 is manufactured in one reaction chamber. The i-type amorphous semiconductor layer 2 actually has an i-conductive type even when the layer 2 contains P, B, and the like of which the concentration is equal to or less than $1 \times 10^{16}$ cm$^{-3}$. Accordingly, the i-type amorphous semiconductor layer 2 may actually have the i-conductive type.

The i-type amorphous semiconductor layer 4 is similar to the i-type amorphous semiconductor layer 2.

An example in which the n-type amorphous semiconductor layer 3 is formed from n-type a-Si is described. However, in Embodiment 1, it is not limited thereto. The n-type amorphous semiconductor layer 3 may be formed from any of n-type a-SiC, n-type a-SiN, n-type a-SiO, n-type a-SiON, n-type a-SiGe, and n-type a-Ge.

An example in which the p-type amorphous semiconductor layer 5 is formed from p-type a-Si is described. However, in Embodiment 1, it is not limited thereto. The p-type amorphous semiconductor layer 5 may be formed from any of p-type a-SiC, p-type a-SiN, p-type a-SiO, p-type a-SiON, p-type a-SiGe, and p-type a-Ge.

In this case, the i-type a-SiC is formed by using the above-described plasma CVD method with a $SiH_4$ gas, a $H_2$ gas, and a methane ($CH_4$) gas as a material gas. The i-type a-SiN is formed by using the above-described plasma CVD method with a $SiH_4$ gas, a $H_2$ gas, and an ammonia ($NH_3$) gas as a material gas. The i-type a-SiO is formed by using the above-described plasma CVD method with a $SiH_4$ gas, a $H_2$ gas, and an $O_2$ gas as a material gas. The i-type a-SiON is formed by using the above-described plasma CVD method with a $SiH_4$ gas, a $H_2$ gas, an $O_2$ gas, and a $NH_3$ gas as a material gas. The i-type a-SiGe is formed by using the above-described plasma CVD method with a $SiH_4$ gas, a $H_2$ gas, and a germane ($GeH_4$) gas as a material gas. The i-type a-Ge is formed by using the above-described plasma CVD method with a $H_2$ gas and a $GeH_4$ gas as a material gas.

The n-type a-SiC is formed by using the above-described plasma CVD method with a $SiH_4$ gas, a $H_2$ gas, a $CH_4$ gas, and a $PH_3$ gas as a material gas. The n-type a-SiN is formed by using the above-described plasma CVD method with a $SiH_4$ gas, a $H_2$ gas, a $NH_3$ gas, and a $PH_3$ gas as a material gas. The n-type a-SiO is formed by using the above-described plasma CVD method with a $SiH_4$ gas, a $H_2$ gas, an $O_2$ gas, and a $PH_3$ gas as a material gas. The n-type a-SiON is formed by using the above-described plasma CVD method with a $SiH_4$ gas, a $H_2$ gas, an $O_2$ gas, a $NH_3$ gas, and a $PH_3$ gas as a material gas. The n-type a-SiGe is formed by using the above-described plasma CVD method with a $SiH_4$ gas, a $H_2$ gas, a $GeH_4$ gas, and a $PH_3$ gas as a material gas. The n-type a-Ge is formed by using the above-described plasma CVD method with a $H_2$ gas, a $GeH_4$ gas, and a $PH_3$ gas as a material gas.

The p-type a-SiC is formed by using the above-described plasma CVD method with a $SiH_4$ gas, a $H_2$ gas, a $CH_4$ gas, and a $B_2H_6$ gas as a material gas. The p-type a-SiN is formed by using the above-described plasma CVD method with a $SiH_4$ gas, a $H_2$ gas, a $NH_3$ gas, and a $B_2H_6$ gas as a material gas. The p-type a-SiO is formed by using the above-described plasma CVD method with a $SiH_4$ gas, a $H_2$ gas, an $O_2$ gas, and a $B_2H_6$ gas as a material gas. The p-type a-SiON is formed by using the above-described plasma CVD method with a $SiH_4$ gas, a $H_2$ gas, an $O_2$ gas, a $NH_3$ gas, and a $B_2H_6$ gas as a material gas. The p-type a-SiGe is formed by using the above-described plasma CVD method with a $SiH_4$ gas, a $H_2$ gas, a $GeH_4$ gas, and a $B_2H_6$ gas as a material gas. The p-type a-Ge is formed by using the above-described plasma CVD method with a $H_2$ gas, a $GeH_4$ gas, and a $B_2H_6$ gas as a material gas.

The photoelectric conversion element 100 may include any of a p-type single crystal silicon substrate, an n-type polycrystal silicon substrate, and a p-type polycrystal silicon substrate, instead of the n-type single crystal silicon substrate 1.

In this case, in each of the p-type single crystal silicon substrate, the n-type polycrystal silicon substrate, and the p-type polycrystal silicon substrate, the thickness of the end-portion region is thinner than the thickness of the central region, and the average surface roughness of the end-portion region is smaller than the average surface roughness of the central region by using the above-described method.

A texture structure is formed on one surface (=light-receiving surface) of the p-type single crystal silicon substrate by using the above-described method. A texture structure is formed on one surface (light-receiving surface) of the n-type polycrystal silicon substrate or the p-type polycrystal silicon substrate by dry etching.

As described above, generally, the photoelectric conversion element 100 may include a silicon substrate.

In the photoelectric conversion element 100, pn junction is not disposed on the light-receiving surface side on which the texture structure is formed, but is disposed on the back surface (surface on an opposite side of the light-receiving surface) which has small average surface roughness. This is because the surface having small average surface roughness causes the open-circuit voltage Voc to be increased.

Embodiment 2

Figure 13:
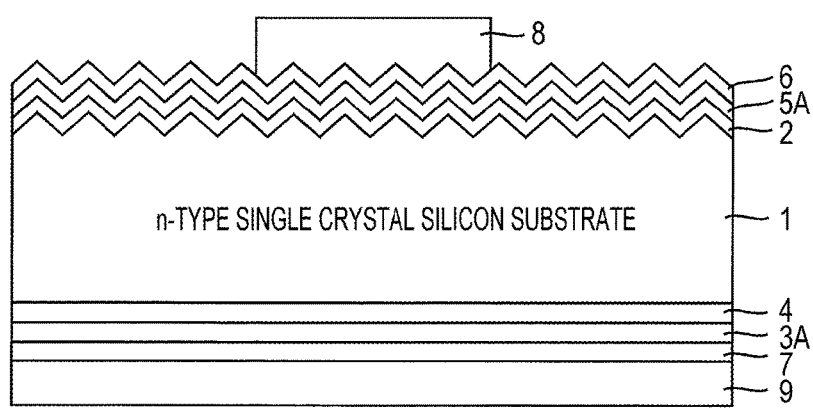
FIG. 13 is a sectional view illustrating a configuration of a photoelectric conversion element according to Embodiment 2.

FIG. 13 is a sectional view illustrating a configuration of a photoelectric conversion element according to Embodiment 2. With reference to FIG. 13, a photoelectric conversion element 200 according to Embodiment 2 is the same as the photoelectric conversion element 100 except that the n-type amorphous semiconductor layer 3 of the photoelectric conversion element 100 illustrated in FIG. 1 is replaced with a p-type amorphous semiconductor layer 5A, and the p-type amorphous semiconductor layer 5 is replaced with an n-type amorphous semiconductor layer 3A.

In the photoelectric conversion element 200, the p-type amorphous semiconductor layer 5A is disposed on the i-type amorphous semiconductor layer 2 so as to be in contact with the i-type amorphous semiconductor layer 2. Other descriptions for the p-type amorphous semiconductor layer 5A are the same as the descriptions for the p-type amorphous semiconductor layer 5.

The n-type amorphous semiconductor layer 3A is disposed on the i-type amorphous semiconductor layer 4 so as to be in contact with the i-type amorphous semiconductor layer 4. Other descriptions for the n-type amorphous semiconductor layer 3A are the same as the descriptions for the n-type amorphous semiconductor layer 3.

As described above, the photoelectric conversion element 200 is a photoelectric conversion element in which p/i amorphous semiconductor layers 2 and 5A are disposed on a light incoming side.

The photoelectric conversion element 200 is manufactured in accordance with the process (a) to the process (i) which are illustrated in FIGS. 11 and 12. In this case, in the process (d), the p-type amorphous semiconductor layer 5A is formed by using the plasma CVD method. In the process (f), the n-type amorphous semiconductor layer 3A is formed by using the plasma CVD method.

The photoelectric conversion element 200 can also exhibit effects similar to the photoelectric conversion element 100.

Other descriptions in Embodiment 2 are the same as the descriptions in Embodiment 1.

Embodiment 3

Figure 14:
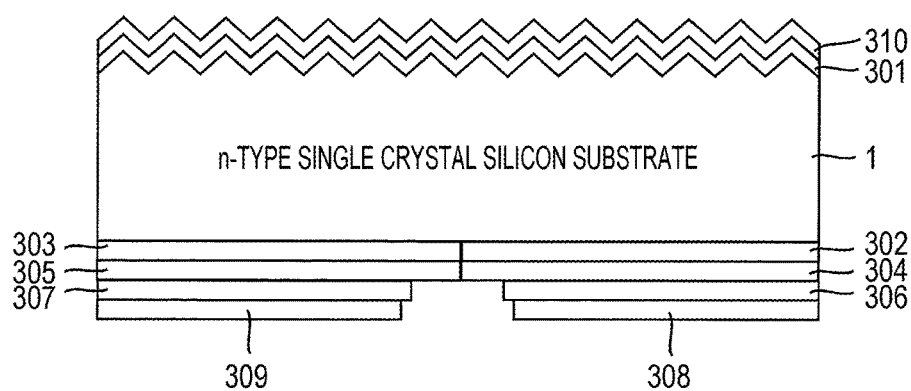
FIG. 14 is a sectional view illustrating a configuration of a photoelectric conversion element according to Embodiment 3.

FIG. 14 is a sectional view illustrating a configuration of a photoelectric conversion element according to Embodiment 3. With reference to FIG. 14, a photoelectric conversion element 300 according to Embodiment 3 includes an n-type single crystal silicon substrate 1, an amorphous semiconductor layer 301, i-type amorphous semiconductor layers 302 and 303, a p-type amorphous semiconductor layer 304, an n-type amorphous semiconductor layer 305, a transparent conductive film 306, 307, electrodes 308 and 309, and an insulating layer 310.

The amorphous semiconductor layer 301 is disposed on the n-type single crystal silicon substrate 1 so as to be in contact with the light-receiving surface of the n-type single crystal silicon substrate 1.

The i-type amorphous semiconductor layers 302 and 303 are disposed on the n-type single crystal silicon substrate 1 so as to be in contact with the back surface (surface on an opposite side of the surface on which the texture structure is formed) of the n-type single crystal silicon substrate 1.

The p-type amorphous semiconductor layer 304 is disposed on the i-type amorphous semiconductor layer 302 so as to be in contact with the i-type amorphous semiconductor layer 302.

The n-type amorphous semiconductor layer 305 is disposed on the i-type amorphous semiconductor layer 303 so as to be in contact with the i-type amorphous semiconductor layer 303.

The transparent conductive film 306 is disposed on the p-type amorphous semiconductor layer 304 so as to be in contact with the p-type amorphous semiconductor layer 304.

The transparent conductive film 307 is disposed on the n-type amorphous semiconductor layer 305 so as to be in contact with the n-type amorphous semiconductor layer 305.

The electrode 308 is disposed on the transparent conductive film 306 so as to be in contact with the transparent conductive film 306.

The electrode 309 is disposed on the transparent conductive film 307 so as to be in contact with the transparent conductive film 307.

The insulating layer 310 is disposed on the amorphous semiconductor layer 301 so as to be in contact with the amorphous semiconductor layer 301.

The amorphous semiconductor layer 301 is formed from an i-type amorphous semiconductor layer/n-type amorphous semiconductor layer or an n-type amorphous semiconductor layer. In a case where the amorphous semiconductor layer 301 is formed from the i-type amorphous semiconductor layer/n-type amorphous semiconductor layer, the i-type amorphous semiconductor layer is disposed so as to be in contact with the n-type single crystal silicon substrate 1, and the n-type amorphous semiconductor layer is disposed so as to be in contact with the i-type amorphous semiconductor layer.

The i-type amorphous semiconductor layer is formed from any of i-type a-SiC, i-type a-SiN, i-type a-SiO, i-type a-SiON, i-type a-Si, i-type a-SiGe, and i-type a-Ge. The i-type amorphous semiconductor layer has the same thickness as that of the i-type amorphous semiconductor layer 2 in Embodiment 1.

The n-type amorphous semiconductor layer is formed from any of n-type a-SiC, n-type a-SiN, n-type a-SiO, n-type a-SiON, n-type a-Si, n-type a-SiGe, and n-type a-Ge. The n-type amorphous semiconductor layer has the same thickness as that of the n-type amorphous semiconductor layer 3 in Embodiment 1.

In a case where the amorphous semiconductor layer 301 is formed from only an n-type amorphous semiconductor layer, the thickness of the n-type amorphous semiconductor layer is sum of the thickness of the i-type amorphous semiconductor layer 2 and the thickness of the n-type amorphous semiconductor layer 3.

In a case where the amorphous semiconductor layer 301 is formed from only an i-type amorphous semiconductor layer, the thickness of the i-type amorphous semiconductor layer is sum of the thickness of the i-type amorphous semiconductor layer 2 and the thickness of the n-type amorphous semiconductor layer 3.

As a result, the amorphous semiconductor layer 301 can suppress a small amount of carriers (holes) generated in the n-type single crystal silicon substrate 1 from reaching the insulating layer 310, and can improve a short-circuit current.

Each of the i-type amorphous semiconductor layers 302 and 303 is formed from any of i-type a-SiC, i-type a-SiN, i-type a-SiO, i-type a-SiON, i-type a-Si, i-type a-SiGe, and i-type a-Ge. Each of the i-type amorphous semiconductor layers 302 and 303 has the same thickness as that of the i-type amorphous semiconductor layer 4 in Embodiment 1. Each of the i-type amorphous semiconductor layers 302 and 303 may substantially have an i-conductive type, similar to the i-type amorphous semiconductor layers 2 and 4 described in Embodiment 1.

The p-type amorphous semiconductor layer 304 is formed from any of p-type a-SiC, p-type a-SiN, p-type a-SiO, p-type a-SiON, p-type a-Si, p-type a-SiGe, and p-type a-Ge. The p-type amorphous semiconductor layer 304 has the same thickness as the p-type amorphous semiconductor layer 5.

The n-type amorphous semiconductor layer 305 is formed from any of n-type a-SiC, n-type a-SiN, n-type a-SiO, n-type a-SiON, n-type a-Si, n-type a-SiGe, and n-type a-Ge. The n-type amorphous semiconductor layer 305 has the same thickness as the p-type amorphous semiconductor layer 304.

Each of the transparent conductive films 306 and 307 is formed from ITO, $SnO_2$, ZnO, and the like.

Each of the electrodes 308 and 309 is formed from a conductive material. An example of the conductive material includes a film formed of metal such as Ag, Cu, Sn, Pt, Au, Pd, Ti, Ta, Ni, Co, and Al, and alloys containing one or more of the above types of metal, or a multilayer film formed of two types or more of the above metal.

The insulating layer 310 is formed from any of silicon oxide, silicon nitride, and silicon oxynitride. The insulating layer 310 has a function as an antireflection coat and a protective film. Considering the function as the antireflection coat, the thickness of the insulating layer 310 is set to be from 80 nm to 300 nm, for example. Thus, it is possible to increase the short-circuit current of the photoelectric conversion element 300. Considering passivation of the surface of the amorphous semiconductor layer 301, it is preferable that the insulating layer 310 is configured by silicon nitride or silicon oxynitride.

Figure 15:
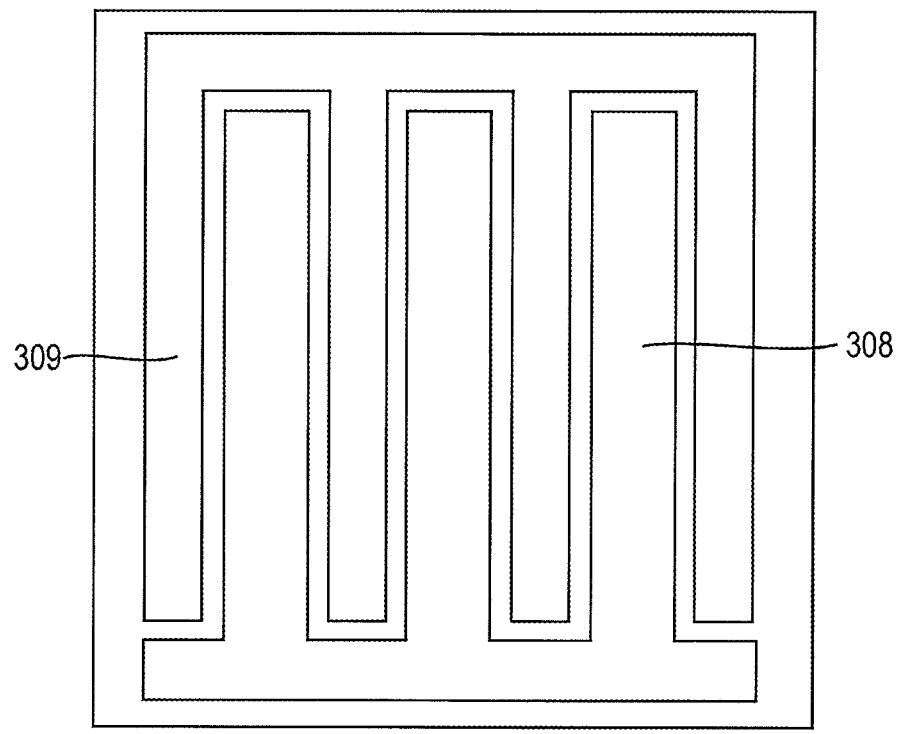
FIG. 15 is a plan view of electrodes on a back surface side of the photoelectric conversion element illustrated in FIG. 14.

FIG. 15 is a plan view of the electrodes 308 and 309 on a back surface side of the photoelectric conversion element 300 illustrated in FIG. 14.

With reference to FIG. 15, each of the electrodes 308 and 309 has a comb shape. The comb shape of the electrode 308 is disposed so as to be fit with the comb shape of the electrode 309.

Figure 16:
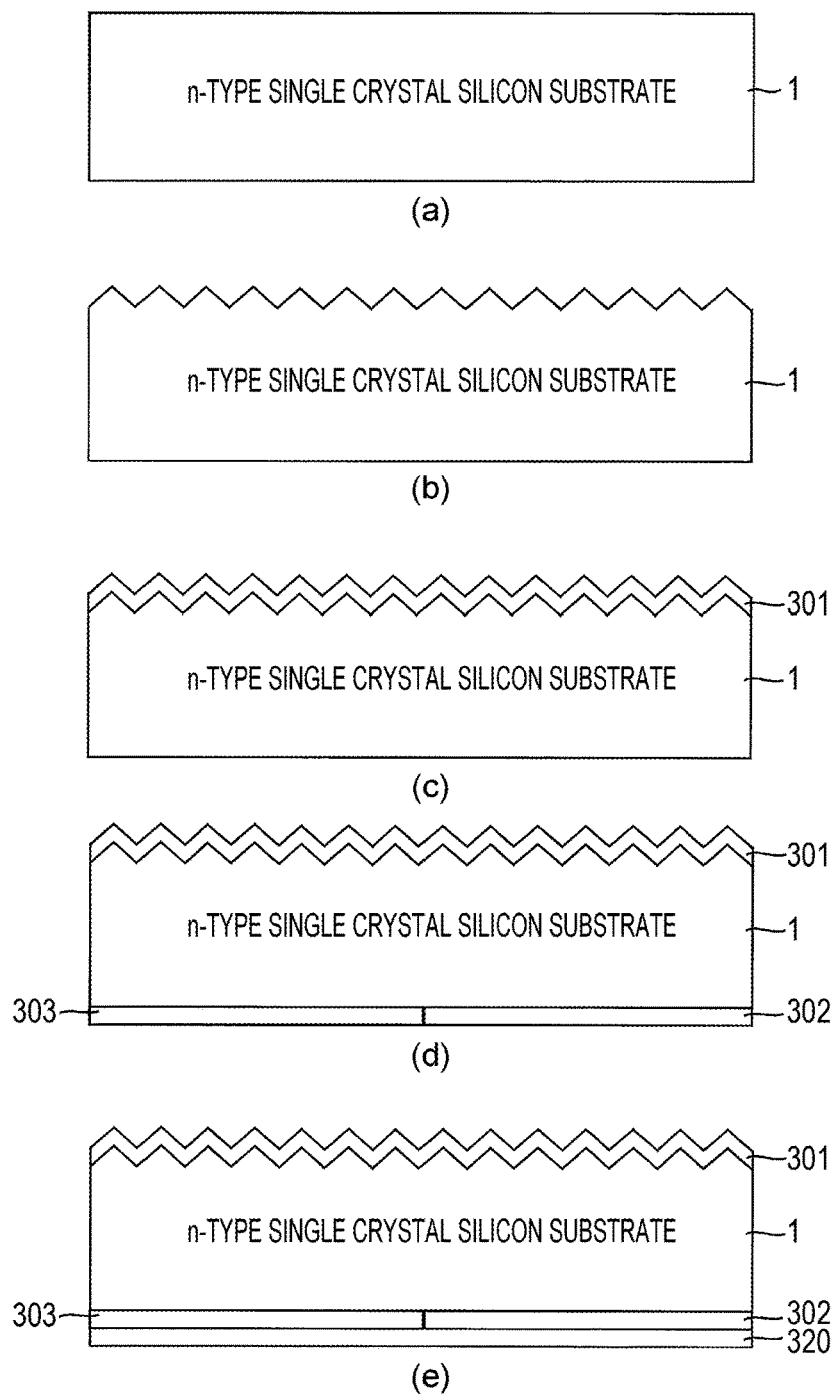
FIG. 16 is a first process diagram illustrating a manufacturing method of the photoelectric conversion element illustrated in FIG. 14.
Figure 17:
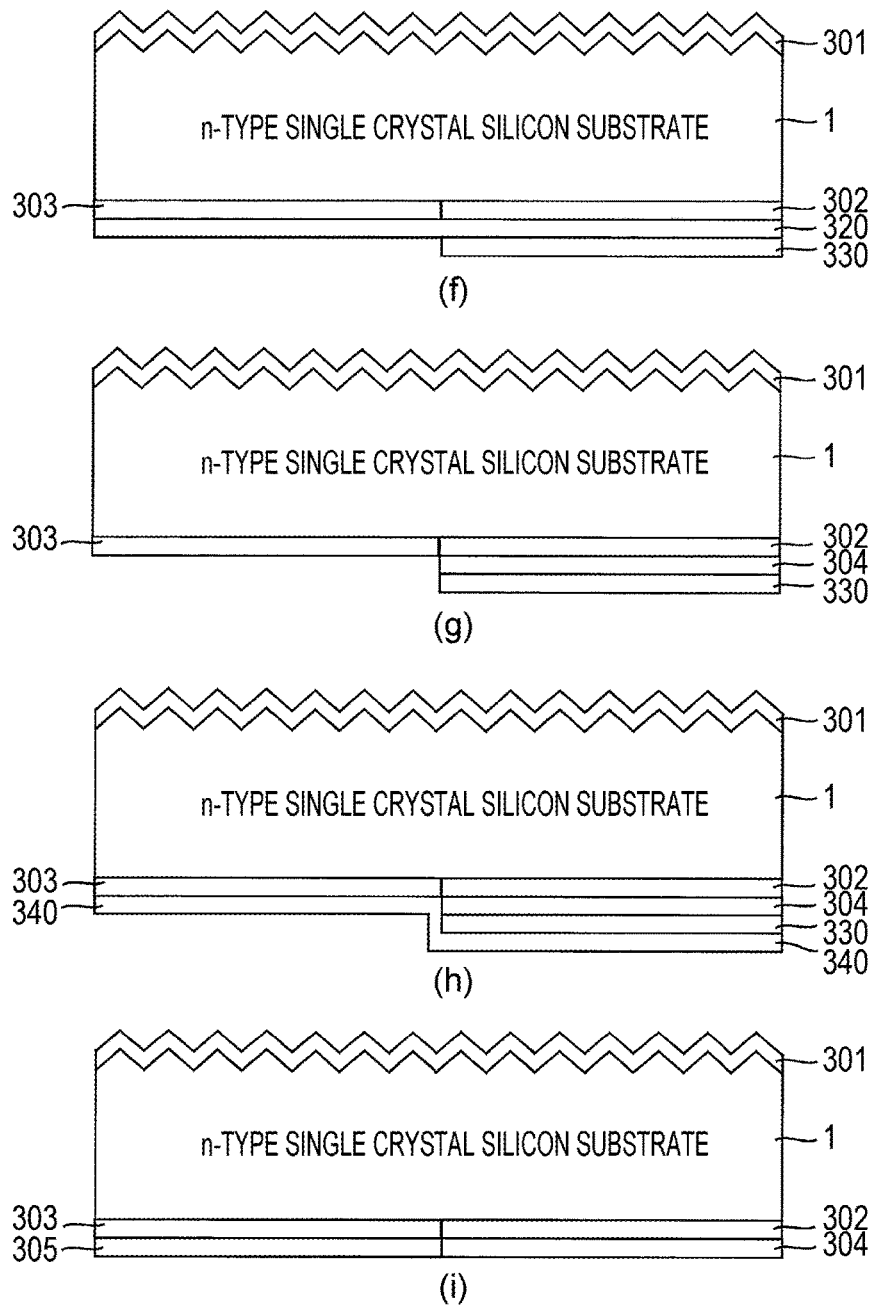
FIG. 17 is a second process diagram illustrating the manufacturing method of the photoelectric conversion element illustrated in FIG. 14.

FIGS. 16 to 18 are respectively first to third process diagrams illustrating a manufacturing method of the photoelectric conversion element 300 illustrated in FIG. 14.

If manufacturing the photoelectric conversion element 300 is started, the same process as the process illustrated in FIG. 11 is performed so as to form the n-type single crystal silicon substrate 1 (see the process (a) in FIG. 16). The process (a) of FIG. 16 also illustrates that the thickness of the n-type single crystal silicon substrate 1 is constant in the central region and the end-portion region. However, actually, the thickness of the n-type single crystal silicon substrate 1 is thinner in the end-portion region than that in the central region.

Then, silicon oxide ($SiO_2$) having a thickness of about 300 nm to 1300 nm is formed on one surface of the n-type single crystal silicon substrate 1 by using a sputtering method. The other surface of the n-type single crystal silicon substrate 1 is textured (see the process (b) in FIG. 16) by chemical anisotropic etching for 30 minutes at a temperature of 80° C. to 90° C. The chemical anisotropic etching is performed by using KOH of 1 weight % to 5 weight %, and IPA of 1 weight % to 10 weight %. In this case, the size of the formed pyramid is, for example, from 10 μm to 15 μm. An inclination angle of the pyramid is an inclination angle between 50 degrees and 60 degrees.

Then, the n-type single crystal silicon substrate 1 is dipped in hydrofluoric acid, and thus silicon oxide and a natural oxide film which have been formed on the surface of the n-type single crystal silicon substrate 1 are removed, and the surface of the n-type single crystal silicon substrate 1 is terminated by using hydrogen.

If washing of the n-type single crystal silicon substrate 1 is ended, the n-type single crystal silicon substrate 1 is put into a reaction chamber of the plasma device.

The amorphous semiconductor layer 301 is formed on the light-receiving surface (surface on which a texture structure is formed) of the n-type single crystal silicon substrate 1 by using a plasma CVD method (see the process (c) in FIG. 16). In a case where the amorphous semiconductor layer 301 is formed from an i-type amorphous semiconductor layer/n-type amorphous semiconductor layer, the i-type amorphous semiconductor layer is formed by using forming conditions which are the same as the above-described forming conditions for the i-type amorphous semiconductor layer 2. The n-type amorphous semiconductor layer is formed by using forming conditions which are the same as the above-described forming conditions for the n-type amorphous semiconductor layer 3. In a case where the amorphous semiconductor layer 301 is formed from an n-type amorphous semiconductor layer, the n-type amorphous semiconductor layer is formed by using forming conditions which are the same as the above-described forming conditions for the n-type amorphous semiconductor layer 3.

After the process (c), the i-type amorphous semiconductor layers 302 and 303 are formed on the back surface (surface on an opposite side of the surface on which the texture structure is formed) of the n-type single crystal silicon substrate 1 by using the plasma CVD method. The formation is performed by using forming conditions which are the same as the above-described forming conditions for the i-type amorphous semiconductor layer 2 (see the process (d) in FIG. 16).

The p-type amorphous semiconductor layer 320 is formed on the i-type amorphous semiconductor layers 302 and 303 by using the plasma CVD method (see the process (e) in FIG. 16). The formation is performed by using forming conditions which are the same as the above-described forming conditions for the p-type amorphous semiconductor layer 5.

Then, the entirety of the surface of the p-type amorphous semiconductor layer 320 is coated with resist. The applied resist is patterned by photolithography, so as to form a resist pattern 330 (see the process (f) in FIG. 17).

A portion of the p-type amorphous semiconductor layer 320 is etched by using the resist pattern 330 as a mask, so as to form the p-type amorphous semiconductor layer 304 (see the process (g) in FIG. 17).

Subsequently, the n-type amorphous semiconductor layer 340 is formed on the i-type amorphous semiconductor layer 303 and the resist pattern 330 by using the plasma CVD method (see the process (h) in FIG. 17). The formation is performed by using forming conditions which are the same as the above-described forming conditions for the n-type amorphous semiconductor layer 3.

The resist pattern 330 is removed by using an alkali solution (KOH, NaOH). Thus, an n-type amorphous semiconductor layer formed on the resist pattern 330 is removed by lift-off, and thus the n-type amorphous semiconductor layer 305 is formed (see the process (i) in FIG. 17).

Then, the insulating layer 310 formed from, for example, silicon nitride is formed on the amorphous semiconductor layer 301 by using a sputtering method (see the process (j) in FIG. 18).

A transparent conductive film (ITO) is formed on the entirety of the surfaces of the p-type amorphous semiconductor layer 304 and the n-type amorphous semiconductor layer 305 by using a sputtering method. Then, Ag is formed by an electron-beam evaporation method. The transparent conductive film (ITO) and Ag are etched so as to form the transparent conductive films 306 and 307, and the electrodes 308 and 309 (see the process (k) in FIG. 18). Thus, the photoelectric conversion element 300 is completed.

As with the photoelectric conversion element 100, the photoelectric conversion element 300 includes the n-type single crystal silicon substrate 1, and pn junction (n-type single crystal silicon substrate 1/p-type amorphous semiconductor layer 304) is disposed on the back surface thereof on an opposite side of the light-receiving surface on which the texture structure is formed. Thus, it is possible to reduce variation in in-surface distribution of the open-circuit voltage Voc, and to improve conversion efficiency of the photoelectric conversion element 300.

In the photoelectric conversion element 300, the transparent conductive film 306 is disposed between the p-type amorphous semiconductor layer 304 and the electrode 308, and the transparent conductive film 307 is disposed between the n-type amorphous semiconductor layer 305 and the electrode 309. Thus, it is possible to suppress recombination of carriers at an interface between the p-type amorphous semiconductor layer 304 and the electrode 308, and at an interface between the n-type amorphous semiconductor layer 305 and the electrode 309.

Light transmitting the n-type single crystal silicon substrate 1 is reflected at the interface between the transparent conductive film 306 and the electrode 308 and at the interface between the transparent conductive film 307 and the electrode 309, and thus it is possible to increase the short-circuit current.

The photoelectric conversion element 300 may not include the transparent conductive film 307. This is because the transparent conductive film 307 is disposed between the n-type amorphous semiconductor layer 305 and the electrode 309 in which many carriers (electrons) are collected, and thus recombination of carriers is not a problem. Accordingly, the photoelectric conversion element 300 may include at least a transparent conductive film which is disposed between the p-type amorphous semiconductor layer 304 and the electrode 308 in which a small amount of carriers (holes) are collected.

The photoelectric conversion element 300 may not include the i-type amorphous semiconductor layers 302 and 303. This is because pn junction (n-type single crystal silicon substrate 1/p-type amorphous semiconductor layer 304) can be formed on the back surface of the n-type single crystal silicon substrate 1 even when the i-type amorphous semiconductor layers 302 and 303 are not provided.

In the above descriptions, an example in which the p-type amorphous semiconductor layer 304 is formed, and then the n-type amorphous semiconductor layer 305 is formed is described. However, in Embodiment 3, it is not limited thereto. The n-type amorphous semiconductor layer 305 may be formed, and then the p-type amorphous semiconductor layer 304 may be formed. Even when the layers 304 and 305 are formed in this manner, the photoelectric conversion element 300 can exhibit the same effects.

Other descriptions in Embodiment 3 are the same as the descriptions in Embodiment 1.

Embodiment 4

FIG. 19 is a sectional view illustrating a configuration of a photoelectric conversion element according to Embodiment 4. With reference to FIG. 19, a photoelectric conversion element 400 according to Embodiment 4 includes an n-type single crystal silicon substrate 401, an antireflection coat 402, an insulating layer 404, electrodes 403 and 405.

The n-type single crystal silicon substrate 401 includes an n-type diffusion layer 4011 and a p-type diffusion layer 4012. The n-type diffusion layer 4011 is disposed on the n-type single crystal silicon substrate 401 so as to be in contact with a light-receiving surface of the n-type single crystal silicon substrate 401. The n-type diffusion layer 4011 has P concentration of $1\times10^{18}$ cm$^{-3}$ to $1\times10^{19}$ cm$^{-3}$, for example. The n-type diffusion layer 4011 has a thickness of 100 nm to 200 nm, for example.

The p-type diffusion layer 4012 is disposed on the n-type single crystal silicon substrate 401 so as to be in contact with a surface of the n-type single crystal silicon substrate 401 on an opposite side of the light-receiving surface. The p-type diffusion layer 4012 has B concentration of $1\times10^{18}$ cm$^{-3}$ to $1\times10^{19}$ cm$^{-3}$, for example. The p-type diffusion layer 4012 has a thickness of 100 nm to 200 nm, for example.

Other descriptions for the n-type single crystal silicon substrate 401 are the same as the descriptions for the n-type single crystal silicon substrate 1.

The antireflection coat 402 is disposed on the n-type single crystal silicon substrate 401 so as to be in contact with the light-receiving surface of the n-type single crystal silicon substrate 401. The antireflection coat 402 is formed from any of silicon oxide, silicon nitride, and silicon oxynitride. Considering a function to prevent reflection of incident light, the antireflection coat 402 has a thickness of 80 nm to 300 nm.

The electrode 403 is disposed so as to pass through the antireflection coat 402 and come into contact with the n-type diffusion layer 4011 of the n-type single crystal silicon substrate 401. The electrode 403 is formed from, for example, Ag.

The insulating layer 404 is disposed on the n-type single crystal silicon substrate 401 so as to be in contact with the back surface (=surface on an opposite side of the light-receiving surface) of the n-type single crystal silicon substrate 401. The insulating layer 404 is formed from the same material as the antireflection coat 402 and has a thickness of 100 nm to 200 nm.

The electrode 405 is disposed so as to pass through the insulating film 404 and come into contact with the p-type diffusion layer 4012 of the n-type single crystal silicon substrate 401. The electrode 405 is formed from, for example, Ag.

As described above, the photoelectric conversion element 400 includes n junction ((bulk region of the n-type single crystal silicon substrate 401)/p-type diffusion layer 4012) on an opposite side of the light-receiving surface on which the texture structure is formed.

Figure 20:
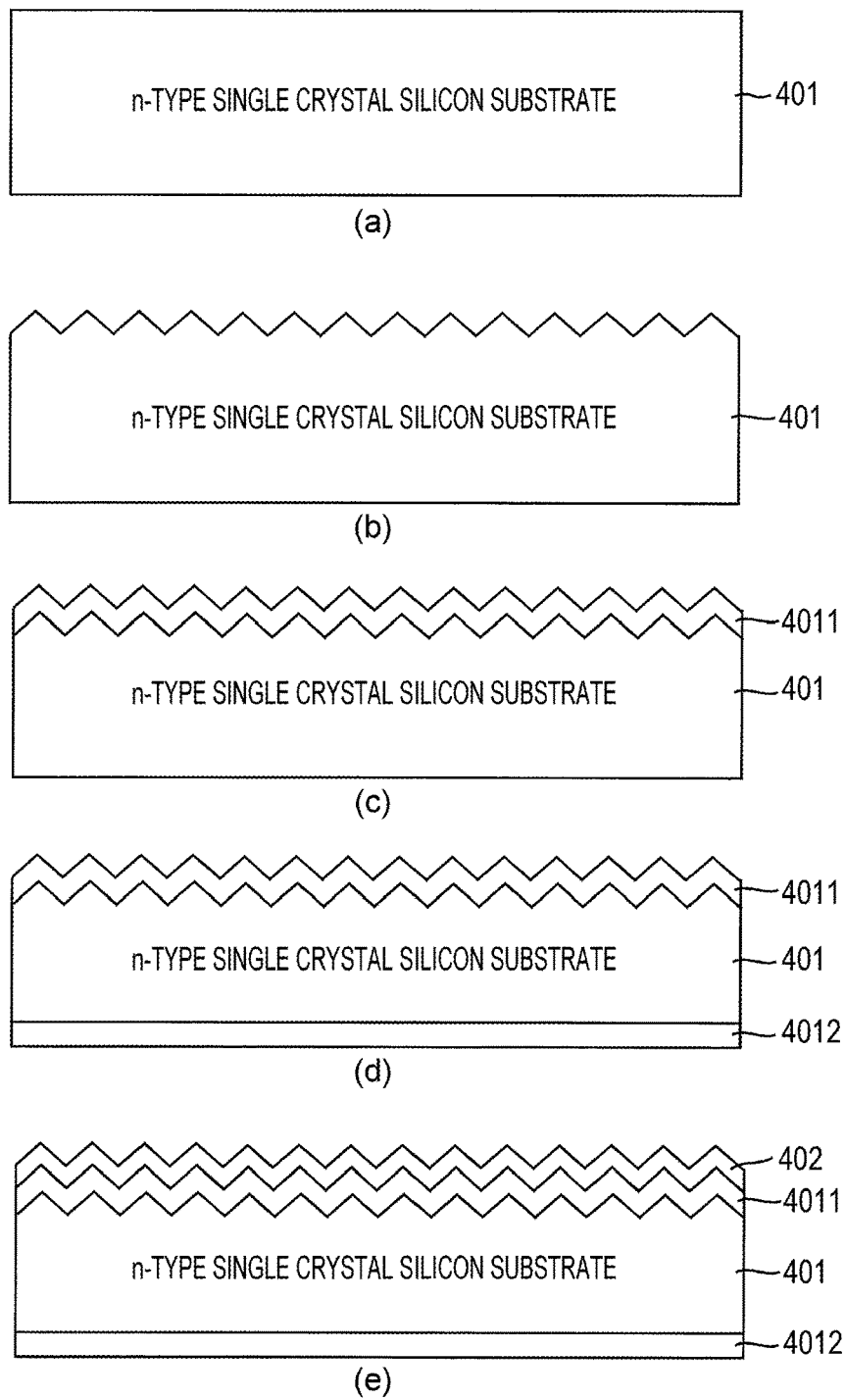
FIG. 20 is a first process diagram illustrating a manufacturing method of the photoelectric conversion element illustrated in FIG. 19.
Figure 21:
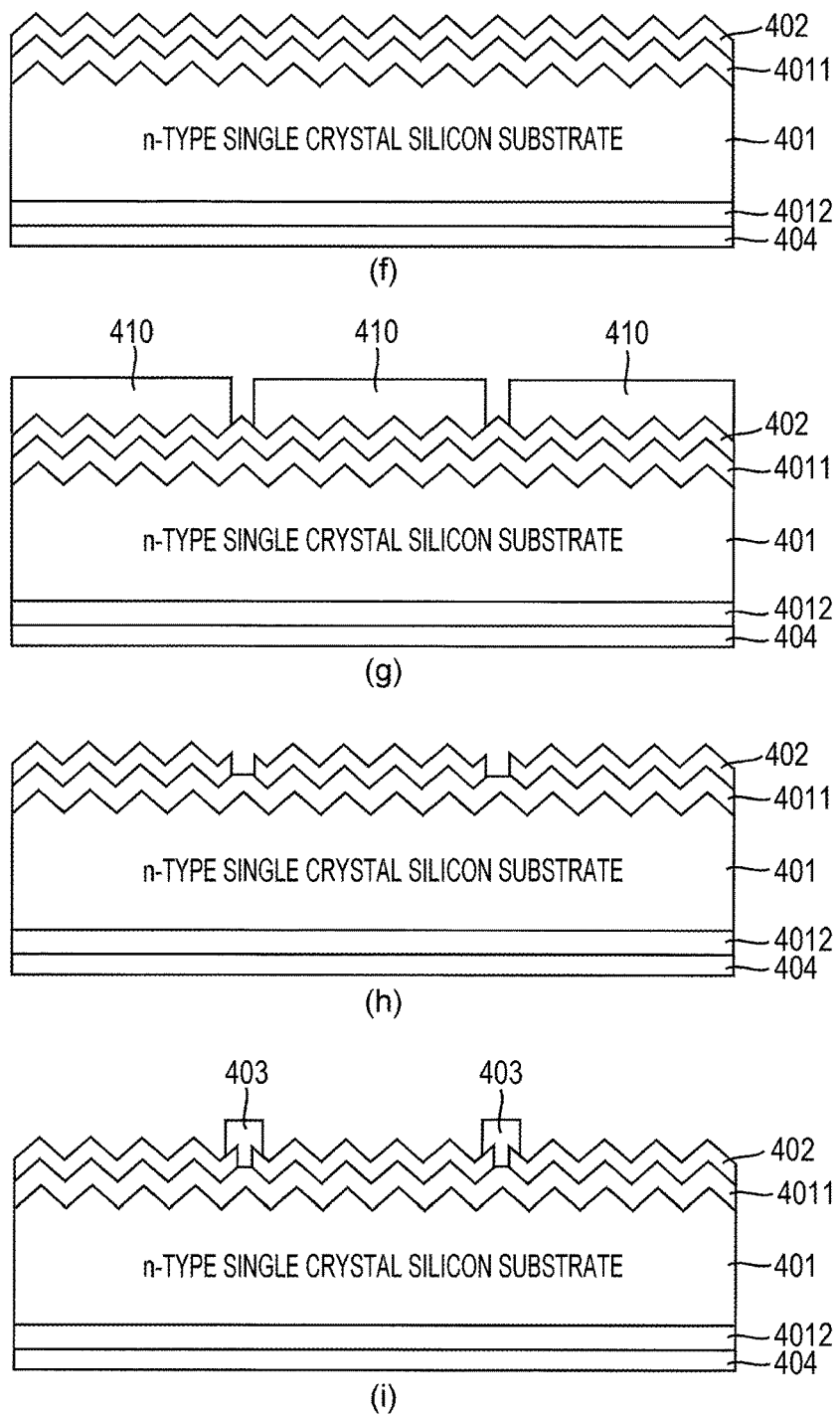
FIG. 21 is a second process diagram illustrating the manufacturing method of the photoelectric conversion element illustrated in FIG. 19.

FIGS. 20 to 22 are respectively first to third process diagrams illustrating a manufacturing method of the photoelectric conversion element 400 illustrated in FIG. 19.

If manufacturing the photoelectric conversion element 400 is started, the same process as the process illustrated in FIG. 11(a) is performed so as to form the n-type single crystal silicon substrate 401 (see the process (a) in FIG. 20). The process (a) of FIG. 20 also illustrates that the thickness of the n-type single crystal silicon substrate 401 is constant in the central region and the end-portion region. However, actually, the thickness of the n-type single crystal silicon substrate 401 is thinner in the end-portion region than that in the central region.

Then, silicon oxide ($SiO_2$) having a thickness of about 100 nm to 300 nm is formed on the back surface of the n-type single crystal silicon substrate 401 by using a sputtering method. The light-receiving surface of the n-type single crystal silicon substrate 401 is subjected to chemically-anisotropic etching for 30 minutes at a temperature of 80° C. to 90° C. The chemically-anisotropic etching is performed by using KOH of 1 weight % to 5 weight %, and IPA of 1 weight % to 10 weight %. The light-receiving surface of the n-type single crystal silicon substrate 401 is textured (see the process (b) in FIG. 20). In this case, the size of the formed pyramid is, for example, from 10 μm to 15 μm. An inclination angle of the pyramid is an inclination angle between 50 degrees and 60 degrees.

Then, P atoms are subjected to vapor-phase diffusion from the light-receiving surface of the n-type single crystal silicon substrate 401 to the n-type single crystal silicon substrate 401, so as to form the n-type diffusion layer 4011 (see the process (c) in FIG. 20).

B atoms are subjected to vapor-phase diffusion from the back surface of the n-type single crystal silicon substrate 401 to the n-type single crystal silicon substrate 401, so as to form the p-type diffusion layer 4012 (see the process (d) in FIG. 20).

Subsequently, the antireflection coat 402 is formed on the light-receiving surface of the n-type single crystal silicon substrate 401 by using a sputtering method (see the process (e) in FIG. 20).

The insulating layer 404 is formed on the back surface of the n-type single crystal silicon substrate 401 by using a sputtering method (see the process (f) in FIG. 21).

Then, the entirety of the surface of the antireflection coat 402 is coated with resist. The applied resist is patterned by photolithography, so as to form a resist pattern 410 (see the process (g) in FIG. 21).

If the resist pattern 410 is formed, a portion of the antireflection coat 402 is etched by using the resist pattern 410 as a mask (see the process (h) in FIG. 21).

Ag paste is printed by screen printing, and the printed Ag paste is fired so as to form the electrode 403 (see the process (i) in FIG. 21).

The entirety of the surface of the insulating layer 404 is coated with resist. The applied resist is patterned by photolithography, so as to form a resist pattern 420 (see the process (j) in FIG. 22).

A portion of the insulating layer 404 is etched by using the resist pattern 420 as a mask (see the process (k) in FIG. 22).

Then, Ag covering the insulating layer 404 is subjected to electron beam evaporation, so as to form the electrode 405 (see the process (l)). Thus, the photoelectric conversion element 400 is completed.

The photoelectric conversion element 400 includes the n-type single crystal silicon substrate 401 in which the thickness of the end-portion region is thinner than the thickness of the central region, and the average surface roughness of the end-portion region is smaller than the average surface roughness of the central region, as with the n-type single crystal silicon substrate 1 of the photoelectric conversion element 100. Thus, it is possible to reduce variation in in-surface distribution of the open-circuit voltage Voc, and to improve conversion efficiency of the photoelectric conversion element 400.

Other descriptions in Embodiment 4 are the same as the descriptions in Embodiment 1.

Embodiment 5

Figure 23:
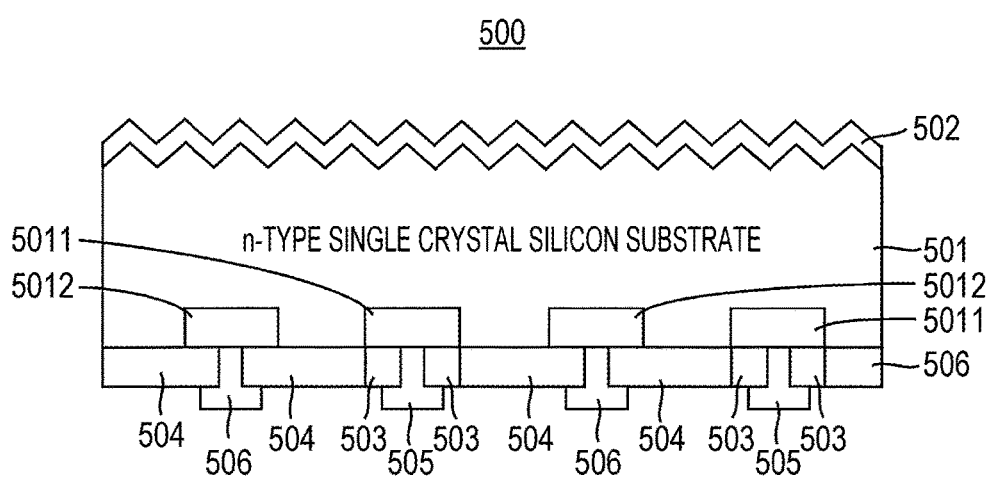
FIG. 23 is a sectional view illustrating a configuration of a photoelectric conversion element according to Embodiment 5.

FIG. 23 is a sectional view illustrating a configuration of a photoelectric conversion element according to Embodiment 5. With reference to FIG. 23, a photoelectric conversion element 500 according to Embodiment 5 includes an n-type single crystal silicon substrate 501, an antireflection coat 502, a first passivation film 503, a second passivation film 504, and electrodes 505 and 506.

The n-type single crystal silicon substrate 501 includes a p-type diffusion layer 5011 and an n-type diffusion layer 5012. The p-type diffusion layer 5011 and the n-type diffusion layer 5012 are in contact with the surface of the n-type single crystal silicon substrate 501 on an opposite side of the light-receiving surface. In this case, the p-type diffusion layer 5011 and the n-type diffusion layer 5012 are alternately disposed in an in-plane direction of the n-type single crystal silicon substrate 501. The p-type diffusion layer 5011 has B concentration of $1\times10^{18}$ $cm^{-3}$ to $1\times10^{19}$ $cm^{-3}$, for example. The p-type diffusion layer 5011 has a thickness of 100 nm to 200 nm, for example. The n-type diffusion layer 5012 has P concentration of $1\times10^{18}$ $cm^{-3}$ to $1\times10^{19}$ $cm^{-3}$, for example. The n-type diffusion layer 5012 has a thickness of 100 nm to 200 nm, for example.

Other descriptions for the n-type single crystal silicon substrate 501 are the same as the descriptions for the n-type single crystal silicon substrate 1.

The antireflection coat 502 is disposed on the n-type single crystal silicon substrate 501 so as to be in contact with the light-receiving surface (surface on which a texture structure is formed) of the n-type single crystal silicon substrate 501. The antireflection coat 502 is formed from, for example, silicon nitride. The antireflection coat 502 has a thickness of 80 nm to 300 nm, for example.

The first passivation film 503 is disposed so as to be in contact with the p-type diffusion layer 5011 of the n-type single crystal silicon substrate 501. The first passivation film 503 is formed from $SiO_2$, for example. The first passivation film 503 has a thickness of 100 nm to 200 nm, for example.

The second passivation film 504 is disposed so as to be in contact with portions other than the p-type diffusion layer 5011 of the n-type single crystal silicon substrate 501. The second passivation film 504 is formed from silicon nitride, for example. The second passivation film 504 has a thickness of 100 nm to 200 nm, for example.

The electrode 505 is disposed so as to pass through the first passivation film 503 and to come into contact with the p-type diffusion layer 5011. The electrode 505 is formed from Ag, for example.

The electrode 506 is disposed so as to pass through the second passivation film 504 and to come into contact with the n-type diffusion layer 5012. The electrode 506 is formed from Ag, for example.

Figure 24:
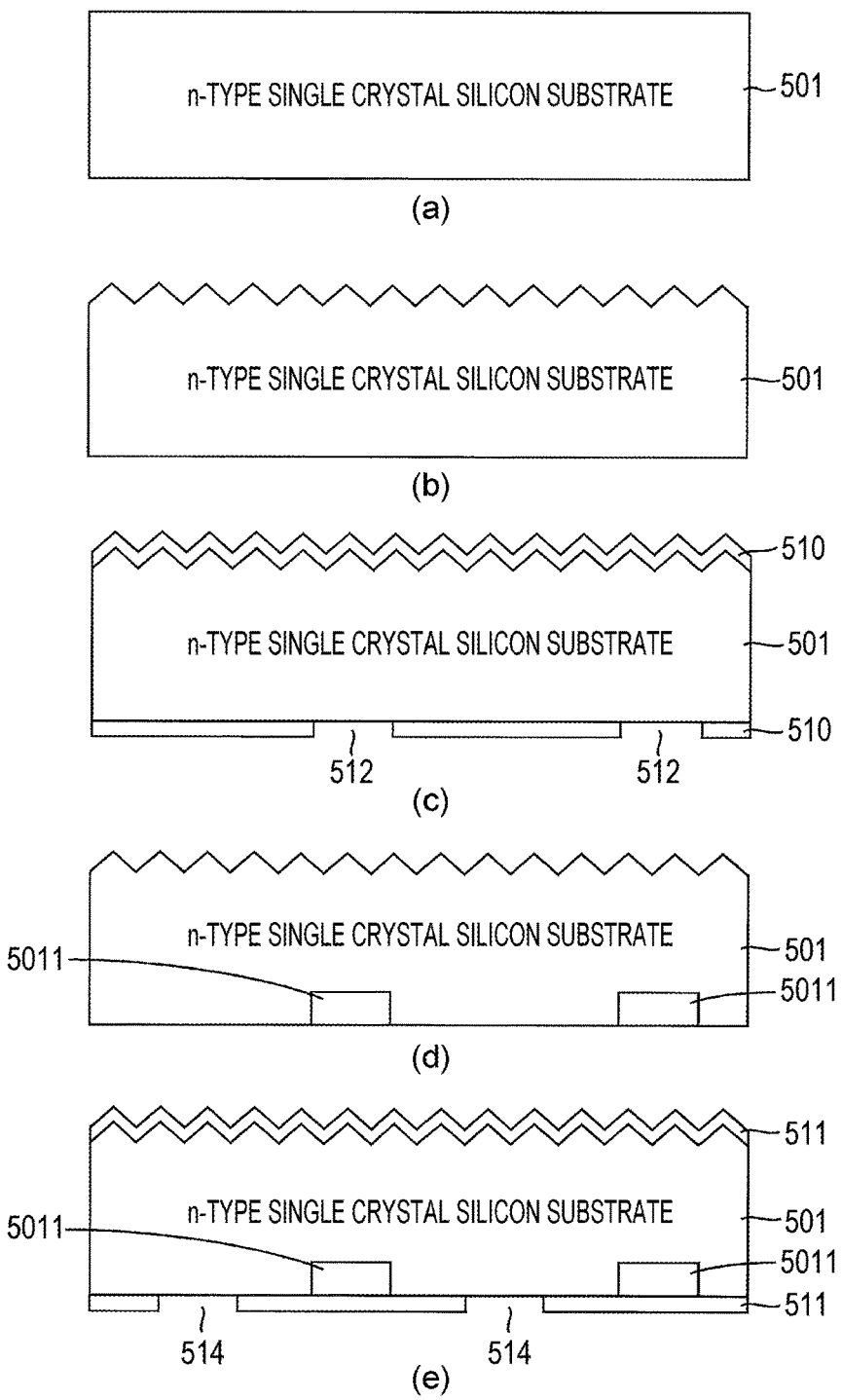
FIG. 24 is a first process diagram illustrating a manufacturing method of the photoelectric conversion element illustrated in FIG. 23.
Figure 25:
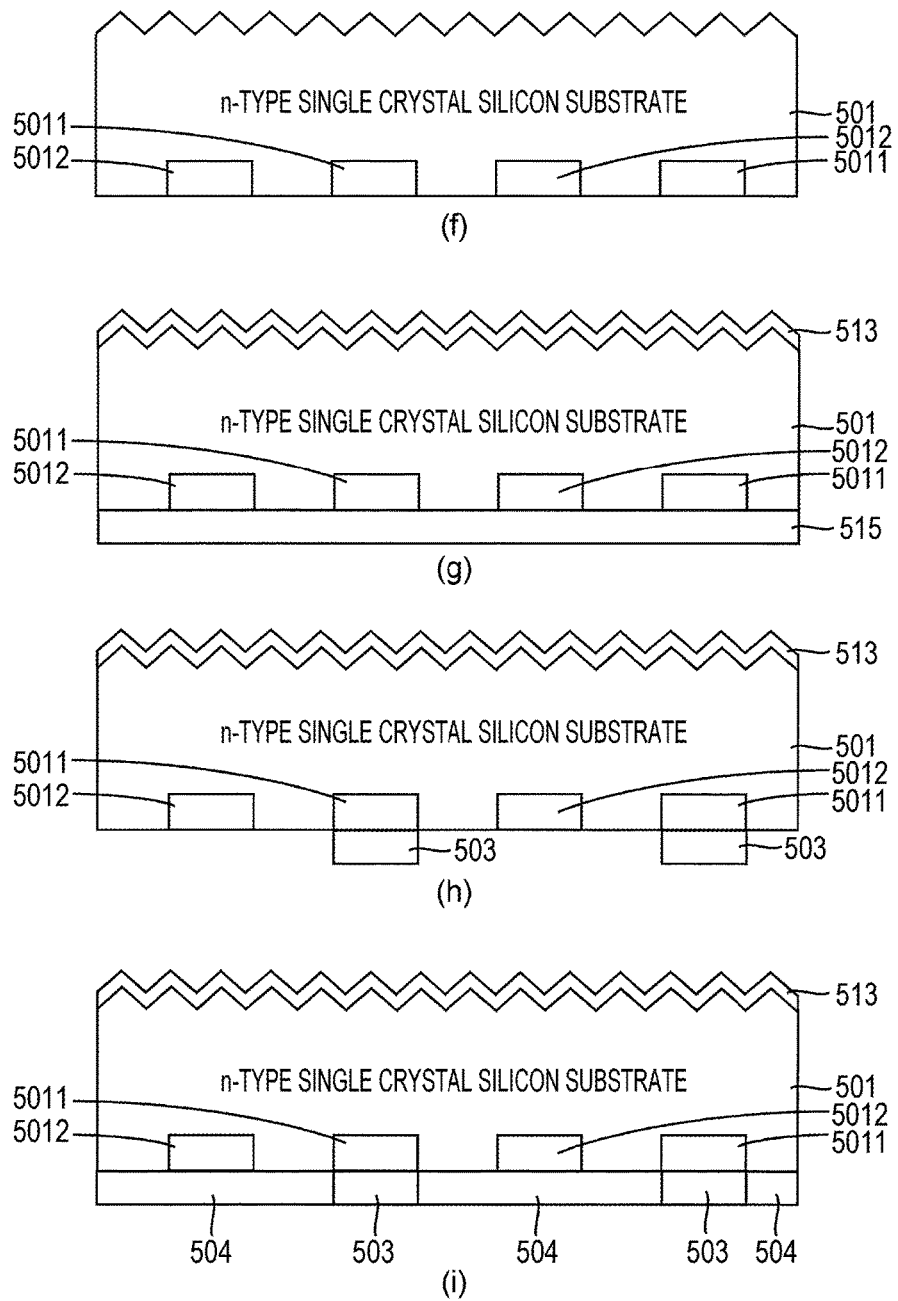
FIG. 25 is a second process diagram illustrating the manufacturing method of the photoelectric conversion element illustrated in FIG. 23.

FIGS. 24 to 26 are respectively first to third process diagrams illustrating a manufacturing method of the photoelectric conversion element 500 illustrated in FIG. 23.

If manufacturing the photoelectric conversion element 500 is started, the same process as the process (a) illustrated in FIG. 11 is performed so as to form the n-type single crystal silicon substrate 501 (see the process (a) in FIG. 24). The process (a) of FIG. 24 also illustrates that the thickness of the n-type single crystal silicon substrate 501 is constant in the central region and the end-portion region. However, actually, the thickness of the n-type single crystal silicon substrate 501 is thinner in the end-portion region than that in the central region.

Then, silicon oxide ($SiO_2$) having a thickness of about 300 nm to 1300 nm is formed on the back surface of the n-type single crystal silicon substrate 501 by using a sputtering method. A light incoming surface of the n-type single crystal silicon substrate 501 is subjected to chemically-anisotropic etching for 30 minutes at a temperature of 80° C. to 90° C. The chemically-anisotropic etching is performed by using KOH of 1 weight % to 5 weight %, and IPA of 1 weight % to 10 weight %. The light incoming surface of the n-type single crystal silicon substrate 501 is textured (see the process (b) in FIG. 24). In this case, the size of the formed pyramid is, for example, from 10 μm to 15 μm. An inclination angle of the pyramid is an inclination angle between 50 degrees and 60 degrees.

A first diffusion mask 510 formed from silicon oxide is formed on the entirety of the light-receiving surface and the back surface of the n-type single crystal silicon substrate 501. Then, a desired pattern is printed on the first diffusion mask 510 formed on the back surface of the n-type single crystal silicon substrate 501. The printing is performed with first etching paste by using a screen printing method. Then, the n-type single crystal silicon substrate 501 on which the first etching paste is printed is thermally treated. Thus, only a portion at which the first etching paste is printed, in the first diffusion mask 510 formed on the back surface of the n-type single crystal silicon substrate 501 is removed by etching. After that, the n-type single crystal silicon substrate 501 is dipped in water. An ultrasonic wave is applied so as to perform ultrasonic washing. Thus, the first etching paste is removed, and a window 512 is formed on the back surface of the n-type single crystal silicon substrate 501 (see the process (c) in FIG. 24).

If the window 512 is formed, B which is p-type impurities is subjected to vapor-phase diffusion to the n-type single crystal silicon substrate 501 through the window 512. B is diffused, and thus boron silicate glass (BSG) is formed on the n-type single crystal silicon substrate 501. The first diffusion mask 510 and the BSG are removed by using a hydrogen fluoride aqueous solution and the like. Accordingly, the p-type diffusion layer 5011 is formed (see the process (d) in FIG. 24).

Then, a second diffusion mask 511 formed from silicon oxide is formed on the entirety of the light-receiving surface and the back surface of the n-type single crystal silicon substrate 501. Then, a desired pattern is printed on the second diffusion mask 511 formed on the back surface of the n-type single crystal silicon substrate 501. The printing is performed with second etching paste by using a screen printing method. Then, the n-type single crystal silicon substrate 501 on which the second etching paste is printed is thermally treated. Thus, only a portion at which the second etching paste is printed, in the second diffusion mask 511 formed on the back surface of the n-type single crystal silicon substrate 501 is removed by etching. After that, the n-type single crystal silicon substrate 501 is dipped in water. An ultrasonic wave is applied so as to perform ultrasonic washing. Thus, the second etching paste is removed, and a window 514 is formed on the back surface of the n-type single crystal silicon substrate 501 (see the process (e) in FIG. 24).

If the window 514 is formed, P which is n-type impurities is subjected to vapor-phase diffusion to the n-type single crystal silicon substrate 501 through the window 514. P is diffused, and thus phosphorus silicate glass (PSG) is formed on the n-type single crystal silicon substrate 501. The second diffusion mask 511 and the PSG are removed by using a hydrogen fluoride aqueous solution and the like. Accordingly, the n-type diffusion layer 5012 is formed (see the process (f) in FIG. 25).

Then, thermal oxidation is performed on the n-type single crystal silicon substrate 501. Thus, a silicon oxide film 513 is formed on the light-receiving surface of the n-type single crystal silicon substrate 501, and a passivation film 515 formed from silicon oxide is formed on the back surface of the n-type single crystal silicon substrate 501 (see the process (g) in FIG. 25).

Etching paste is printed on portions of the passivation film 515 other than a portion thereof formed on the p-type diffusion layer 5011, by using a screen printing method. Then, the n-type single crystal silicon substrate 501 is thermally treated. Thus, the portions of the passivation film 515 other than the portion formed on the p-type diffusion layer 5011 are removed, and thus a first passivation film 503 is formed on the p-type diffusion layer 5011 (see the process (h) in FIG. 25).

Then, a second passivation film 504 formed from silicon nitride is formed on the back surface of the n-type single crystal silicon substrate 501 by using a plasma CVD method (see the process (i) in FIG. 25).

The silicon oxide film 513 formed on the light-receiving surface of the n-type single crystal silicon substrate 501 is removed by using a hydrogen fluoride aqueous solution and the like, and the antireflection coat 502 formed from silicon nitride is formed on the light-receiving surface of the n-type single crystal silicon substrate 501 (see the process (j) in FIG. 26).

Etching paste is printed on a portion of the first passivation film 503 and on a portion of the second passivation film 504, which is positioned on the n-type diffusion layer 5012, by using a screen printing method. The n-type single crystal silicon substrate 501 is thermally treated. Thus, the portion of the first passivation film 503 and the portion of the second passivation film 504 are removed, and thus contact holes 516 and 517 are formed (see the process (k) in FIG. 26).

After that, Ag paste is printed in the contact holes 516 and 517, and the printed Ag paste is fired. Thus, the electrodes 505 and 506 are formed, and the photoelectric conversion element 500 is completed (see the process (1) in FIG. 26).

The photoelectric conversion element 500 includes the n-type single crystal silicon substrate 501 in which the thickness of the end-portion region is thinner than the thickness of the central region, and the average surface roughness of the end-portion region is smaller than the average surface roughness of the central region, as with the n-type single crystal silicon substrate 1 of the photoelectric conversion element 100. Thus, it is possible to reduce variation in in-surface distribution of the open-circuit voltage Voc, and to improve conversion efficiency of the photoelectric conversion element 500.

Other descriptions in Embodiment 5 are the same as the descriptions in Embodiment 1.

Embodiment 6

Figure 27:
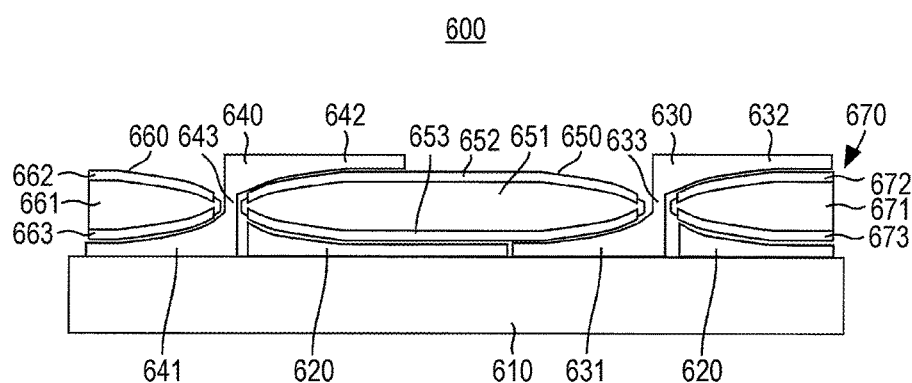
FIG. 27 is a sectional view illustrating a configuration of a solar cell module according to Embodiment 6.

FIG. 27 is a sectional view illustrating a configuration of a solar cell module according to Embodiment 6. With reference to FIG. 27, a solar cell module 600 according to Embodiment 6 includes a back sheet 610, a spacer 620, interconnects 630 and 640, photoelectric conversion elements 650, 660, and 670.

The photoelectric conversion element 650 includes an n-type single crystal silicon substrate 651, and electrodes 652 and 653. The photoelectric conversion element 660 includes an n-type single crystal silicon substrate 661, and electrodes 662 and 663. The photoelectric conversion element 670 includes an n-type single crystal silicon substrate 671, and electrodes 672 and 673.

Each of the photoelectric conversion elements 650, 660, and 670 has the same configuration as the photoelectric conversion element 100. Thus, each of the n-type single crystal silicon substrates 651, 661, and 671 is the same as the n-type single crystal silicon substrate 1.

The photoelectric conversion elements 650, 660, and 670 are disposed on the back sheet 610.

The interconnect 630 is disposed between the back sheet 610 and the photoelectric conversion element 650, between the photoelectric conversion elements 650 and 670, and on the photoelectric conversion element 670. The interconnect 630 includes a first connection portion 631, a second connection portion 632, and a third connection portion 633. The first connection portion 631 is disposed between the photoelectric conversion element 650 and the back sheet 610, so as to be in contact with the electrode 653 which is provided on an opposite side of the light-receiving surface of the photoelectric conversion element 650. The thickness of the first connection portion 631 becomes thicker from the central region of the n-type single crystal silicon substrate 651 of the photoelectric conversion element 650 toward the end-portion region thereof. The second connection portion 632 has a thickness which becomes thicker from the central region of the photoelectric conversion element 670 toward the end-portion region thereof. The second connection portion 632 is disposed so as to be in contact with the electrode 672 which is provided on the light-receiving surface side of the photoelectric conversion element 670. The third connection portion 633 is disposed between the photoelectric conversion element 650 and the photoelectric conversion element 670 in an in-plane direction of the back sheet 610. The third connection portion 633 connects the first connection portion 631 and the second connection portion 632 to each other. The interconnect 630 is connected to the electrode 653 of the photoelectric conversion element 650 and the electrode 672 of the photoelectric conversion element 670 by the first connection portion 631, the second connection portion 632, and the third connection portion 633.

The interconnect 640 includes a first connection portion 641, a second connection portion 642, and a third connection portion 643, as with the interconnect 630. The first connection portion 641 is the same as the first connection portion 631. The second connection portion 642 is the same as the second connection portion 632. The third connection portion 643 is the same as the third connection portion 633.

Accordingly, the interconnect 640 is connected to the electrode 663 of the photoelectric conversion element 660 and the electrode 652 of the photoelectric conversion element 650 by the first connection portion 641, the second connection portion 642, and the third connection portion 643.

In the solar cell module 600, a difference in thickness between end portions of the interconnects 630 and 640, and connection portions of the interconnects 630 and 640 with the electrodes 653 and 663 of the photoelectric conversion elements 650 and 660 is from 10 μm to 100 μm.

The spacer 620 is disposed in a region other than a region in which the first connection portion 631 of the interconnect 630 is disposed, in regions between the photoelectric conversion element 650 and the back sheet 610, and between the photoelectric conversion element 670 and the back sheet 610. The thickness of spacers 620 becomes thicker from the central regions of the photoelectric conversion elements 650 and 670 toward the end-portion region thereof. The spacer 620 is formed from an insulating material. The spacer 620 is preferably formed from a resin for light weight. The resin is preferably formed from a resin which has thermal resistance, and is more preferably formed from a resin which has excellent dissipative characteristics.

As described above, the solar cell module 600 includes the spacer 620 and the interconnects 630 and 640 of which the thickness becomes thicker from the central regions of the n-type single crystal silicon substrates 651, 661, and 671 toward the end-portion regions thereof, similarly to the cross sectional shape of the n-type single crystal silicon substrates 651, 661, and 671 of the photoelectric conversion elements 650, 660, and 670.

As a result, even when the photoelectric conversion elements 650, 660, and 670 have a cross sectional shape in which the thickness becomes thinner from the central region toward the end-portion region, it is possible to horizontally dispose the photoelectric conversion elements 650, 660, and 670 on the back sheet 610, and to connect the photoelectric conversion elements 650, 660, and 670 to each other in series.

The photoelectric conversion elements 650, 660, and 670 respectively include the n-type single crystal silicon substrate 651, 661, and 671 (=n-type single crystal silicon substrate 1) in which the thickness of the end-portion region is thinner than the thickness of the central region, and the average surface roughness of the end-portion region is smaller than the average surface roughness of the central region. Thus, it is possible to reduce in-surface variation of the open-circuit voltage, and to improve conversion efficiency of the solar cell module 600.

The solar cell module 600 may include any of the photoelectric conversion elements 200 and 400 instead of the photoelectric conversion element 100. Generally, the solar cell module 600 may include a photoelectric conversion element which includes electrodes on the light-receiving surface side and the back surface side of the n-type single crystal silicon substrate, has a cross sectional shape of which the thickness becomes thinner from the central region toward the end-portion region, and in which the average surface roughness of the end-portion region is smaller than the average surface roughness of the central region.

Embodiment 7

Figure 28:
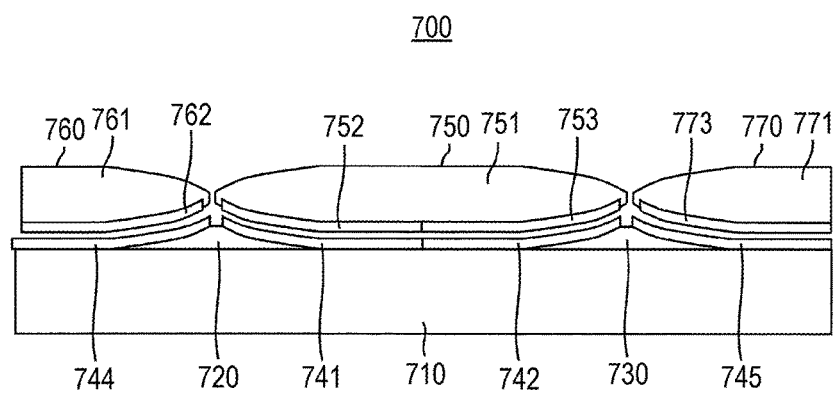
FIG. 28 is a sectional view illustrating a configuration of a solar cell module according to Embodiment 7.

FIG. 28 is a sectional view illustrating a configuration of a solar cell module according to Embodiment 7. With reference to FIG. 28, a solar cell module 700 according to Embodiment 7 includes a back sheet 710, contact tabs 720 and 730, p-type wiring sheets 741 and 745, n-type wiring sheets 742 and 744, and photoelectric conversion elements 750, 760, and 770.

The photoelectric conversion element 750 includes an n-type single crystal silicon substrate 751, a p-type electrode 752, and an n-type electrode 753. The photoelectric conversion element 760 includes an n-type single crystal silicon substrate 761 and an n-type electrode 762. The photoelectric conversion element 770 includes an n-type single crystal silicon substrate 771 and a p-type electrode 773.

Each of the photoelectric conversion elements 750, 760, and 770 is configured from the photoelectric conversion element 300, for example. Accordingly, each of the n-type single crystal silicon substrates 751, 761, and 771 has the same structure as the n-type single crystal silicon substrate 1. The p-type electrode 752 and the n-type electrode 753 are disposed on the back surface of the n-type single crystal silicon substrate 751. The n-type electrode 762 is disposed on the back surface of the n-type single crystal silicon substrate 761. The p-type electrode 773 is disposed on the back surface of the n-type single crystal silicon substrate 771.

The contact tab 720 is disposed on the back sheet 710. The contact tab 720 has a thickness which is thickest between the two photoelectric conversion elements 750 and 760 which are adjacent to each other, and gradually becomes thinner toward the central region of the n-type single crystal silicon substrate 761 of the one photoelectric conversion element 760 and the central region of the n-type single crystal silicon substrate 751 of another photoelectric conversion element 750. That is, the contact tab 720 has a protrusion portion which protrudes toward an opposite side of the back sheet 710.

Similarly, the contact tab 730 is also disposed on the back sheet 710. The contact tab 730 has a thickness which is thickest between the two photoelectric conversion elements 750 and 770 which are adjacent to each other, and gradually becomes thinner toward the central region of the n-type single crystal silicon substrate 751 of one photoelectric conversion element 750 and the central region of the n-type single crystal silicon substrate 771 of another photoelectric conversion element 770. That is, the contact tab 730 has a protrusion portion which protrudes toward an opposite side of the back sheet 710.

The height of the protrusion portions of the contact tabs 720 and 730 is from 10 μm to 100 μm, for example.

The p-type wiring sheet 741 and the n-type wiring sheet 744 are disposed so as to be in contact with the back sheet 710 and the contact tab 720. The n-type wiring sheet 742 and the p-type wiring sheet 745 are disposed so as to be in contact with the back sheet 710 and the contact tab 730.

The contact tabs 720 and 730, the p-type wiring sheets 741 and 745, and the n-type wiring sheets 742 and 744 are formed from Cu, Ag, Al, and the like.

The photoelectric conversion element 750 is disposed on the back sheet 710 so as to cause the p-type electrode 752 to be in contact with the p-type wiring sheet 741, and to cause the n-type electrode 753 to be in contact with the n-type wiring sheet 742. The photoelectric conversion element 760 is disposed on the back sheet 710 so as to cause the n-type electrode 762 to be in contact with the n-type wiring sheet 744. The photoelectric conversion element 770 is disposed on the back sheet 710 so as to cause the p-type electrode 773 to be in contact with the p-type wiring sheet 745.

The n-type electrode 762 of the photoelectric conversion element 760 is electrically connected to the contact tab 720 through the n-type wiring sheet 744. The p-type electrode 752 of the photoelectric conversion element 750 is electrically connected to the contact tab 720 through the p-type wiring sheet 741. The n-type electrode 753 of the photoelectric conversion element 750 is electrically connected to the contact tab 730 through the n-type wiring sheet 742. The p-type electrode 773 of the photoelectric conversion element 770 is electrically connected to the contact tab 730 through the p-type wiring sheet 745.

Accordingly, the photoelectric conversion elements 750, 760, and 770 are electrically connected in series to each other through the contact tabs 720 and 730, the p-type wiring sheets 741 and 745, and the n-type wiring sheets 742 and 744.

Figure 29:
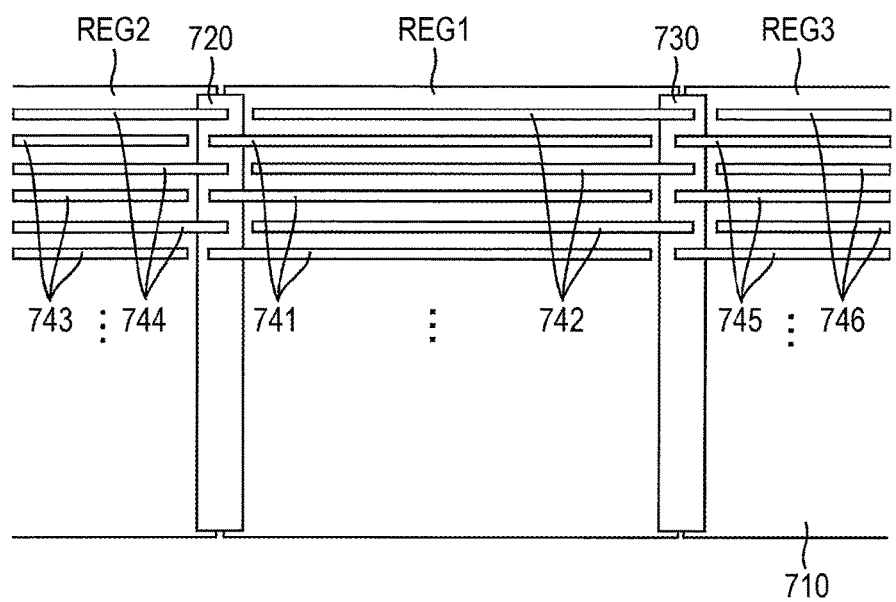
FIG. 29 is a plan view obtained by viewing a back sheet, a contact tab, a p-type wiring sheet, and an n-type wiring sheet of the solar cell module from an upper side.

FIG. 29 is a plan view obtained by viewing the back sheet 710, the contact tabs 720 and 730, the p-type wiring sheets 741, 743, and 745, and the n-type wiring sheets 742, 744, and 746 of the solar cell module 700 from an upper side.

With reference to FIG. 29, the solar cell module 700 further includes the p-type wiring sheet 743 and the n-type wiring sheet 746. The p-type wiring sheet 743 and the n-type wiring sheet 746 are formed from Cu, Ag, Al, and the like.

The contact tabs 720 and 730 are disposed on the back sheet 710. The p-type wiring sheet 741 has one end in contact with the contact tab 720, and another end which is not in contact with the contact tab 730. The n-type wiring sheet 742 has one end which is not in contact with the contact tab 720, and another end in contact with the contact tab 730. The p-type wiring sheet 741 and the n-type wiring sheet 742 are alternately disposed in a vertical direction on a surface of paper in FIG. 29.

The p-type wiring sheet 743 has one end which is not in contact with the contact tab 720. The n-type wiring sheet 744 has one end in contact with the contact tab 720. The p-type wiring sheet 743 and the n-type wiring sheet 744 are alternately disposed in the vertical direction on the surface of paper in FIG. 29.

The p-type wiring sheet 745 has one end in contact with the contact tab 730. The n-type wiring sheet 746 has one end which is not in contact with the contact tab 730. The p-type wiring sheet 745 and the n-type wiring sheet 746 are alternately disposed in the vertical direction on the surface of paper in FIG. 29.

The p-type wiring sheets 741, 743, and 745 are disposed in a transverse direction on the surface of paper in FIG. 29, so as to have a straight line shape. The n-type wiring sheets 742, 744, and 746 are disposed in the transverse direction on the surface of paper in FIG. 29, so as to have a straight line shape.

Regions REG1 to REG3 are regions in which the photoelectric conversion elements 750, 760, and 770 are disposed.

In the photoelectric conversion element 750, the p-type electrode 752 is actually configured from a plurality of p-type electrodes. The n-type electrode 753 is actually configured from a plurality of n-type electrodes. The plurality of p-type electrodes and the plurality of n-type electrodes are alternately disposed in an in-plane direction of the n-type single crystal silicon substrate 751. The n-type electrode 762 of the photoelectric conversion element 760 and the p-type electrode 773 of the photoelectric conversion element 770 are respectively similar to the p-type electrode 752 and the n-type electrode 753.

Thus, the photoelectric conversion element 750 is disposed in the region REG1 so as to cause the plurality of p-type electrodes (p-type electrode 752) of the photoelectric conversion element 750 to be in contact with a plurality of p-type wiring sheets 741, and to cause the plurality of n-type electrodes (n-type electrode 753) to be in contact with a plurality of n-type wiring sheets 742.

The photoelectric conversion elements 760 and 770 are respectively disposed in the regions REG2 and REG3, similar to the photoelectric conversion element 750.

As described above, the solar cell module 700 includes the contact tabs 720 and 730 which have a protrusion portion which protrudes toward the opposite side of the back sheet 710. The p-type wiring sheets 741, 743, and 745 and the n-type wiring sheets 742, 744, and 746 are disposed so as to be in contact with the back sheet 710 and the contact tabs 720 and 730. Thus, it is possible to horizontally dispose the photoelectric conversion elements 750, 760, and 770 and to electrically connect the photoelectric conversion elements 750, 760, and 770 to each other in series even when the end-portion regions of the n-type single crystal silicon substrates 751, 761, and 771 in the photoelectric conversion elements 750, 760, and 770 have a cross sectional shape in which the thickness is thinner than that in the central region.

The photoelectric conversion elements 750, 760, and 770 respectively include the n-type single crystal silicon substrates 751, 761, and 771 (=the n-type single crystal silicon substrate 1) in which the thickness of the end-portion region is thinner than the thickness of the central region, the average surface roughness of the end-portion region is smaller than the average surface roughness of the central region. Thus, it is possible to reduce in-surface variation of the open-circuit voltage, and to improve conversion efficiency of the solar cell module 700.

Figure 30:
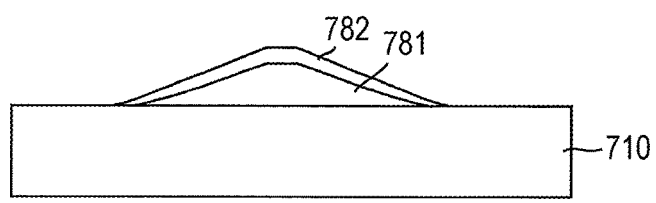
FIG. 30 is a diagram illustrating another specific example of the contact tab.

FIG. 30 is a diagram illustrating another specific example of the contact tab. With reference to FIG. 30, the contact tab 780 includes a resin 781 and a contact electrode 782.

The resin 781 is configured from a shape having a protrusion portion which protrudes toward the opposite side of the back sheet 710. The resin 781 is disposed on the back sheet 710. The resin 781 is preferably configured from a material having thermal resistance, and particularly preferably configured from a material having excellent dissipative properties.

The contact electrode 782 is disposed on the back sheet 710 so as to cover the resin 781.

As a result, the contact tab 780 has a cross-sectional shape which is the same as that of the above-described contact tabs 720 and 730.

The solar cell module 700 may include the contact tab 780 instead of the contact tabs 720 and 730. In this case, the p-type wiring sheets 741, 743, and 745 and the n-type wiring sheets 742, 744, and 746 are disposed on the back sheet 710 and the contact tab 780 so as to be in contact with the contact electrode 782.

It is possible to reduce the weight of the solar cell module 700 by using the contact tab 780.

The solar cell module 700 may include the photoelectric conversion element 500 instead of the photoelectric conversion element 300. Generally, the solar cell module 700 may include a photoelectric conversion element in which a p-type electrode and an n-type electrode are disposed on the back surface which is on an opposite side of the light incoming surface, the thickness becomes thinner from the central region toward the end-portion region, and the average surface roughness of the end-portion region is smaller than the average surface roughness of the central region.

The solar cell module 700 may include a p-type wiring sheet and an n-type wiring sheet which are respectively disposed so as to be in contact with a p-type electrode and an n-type electrode. The p-type electrode and an n-type electrode are disposed on the back surface side of the photoelectric conversion element. Accordingly, the solar cell module 700 may include a back sheet 710, first and second photoelectric conversion elements (750, 760), a first wiring sheet (741), a second wiring sheet (742), a third wiring sheet (744), a fourth wiring sheet (743), and a contact tab 720. The first and second photoelectric conversion elements (750, 760) are disposed on the back sheet 710 and are adjacent to each other in an in-plane direction of the back sheet 710. The first wiring sheet (741) is disposed between the back sheet 710 and the first photoelectric conversion element (750), and disposed so as to be in contact with either of a positive electrode (752) and a negative electrode (753) in the first photoelectric conversion element (750). The second wiring sheet (742) is disposed between the back sheet 710 and the first photoelectric conversion element (750), and is disposed so as to be in contact with the other electrode of the positive electrode (752) and the negative electrode (753) in the first photoelectric conversion element (750). The third wiring sheet (744) is disposed between the back sheet 710 and the second photoelectric conversion element (760), and is disposed so as to be in contact with either of a positive electrode and a negative electrode (762) in the second photoelectric conversion element (760). The fourth wiring sheet (743) is disposed between the back sheet 710 and the second photoelectric conversion element (760), and is disposed so as to be in contact with the other electrode of the positive electrode and the negative electrode (762) in the second photoelectric conversion element (760). The contact tab 720 is disposed between the first and third wiring sheets (741 and 744) and the back sheet 710 in a region from the end-portion region of the first photoelectric conversion element (750) to the end-portion region of the second photoelectric conversion element (760) in the in-plane direction of the back sheet 710. The contact tab 720 is disposed so as to be in contact with the first and third wiring sheets (741 and 744). Each of the first and second photoelectric conversion elements (750 and 760) may be configured from the photoelectric conversion element 300 or the photoelectric conversion element 500. The contact tab 720 may have a thickness which is thickest between the first photoelectric conversion element (750) and the second photoelectric conversion element (760), and gradually becomes thin toward the central region of the silicon substrate (751) of the first photoelectric conversion element (750) and the central region of the silicon substrate (761) of the second photoelectric conversion element (760).

Embodiment 8

Figure 31:
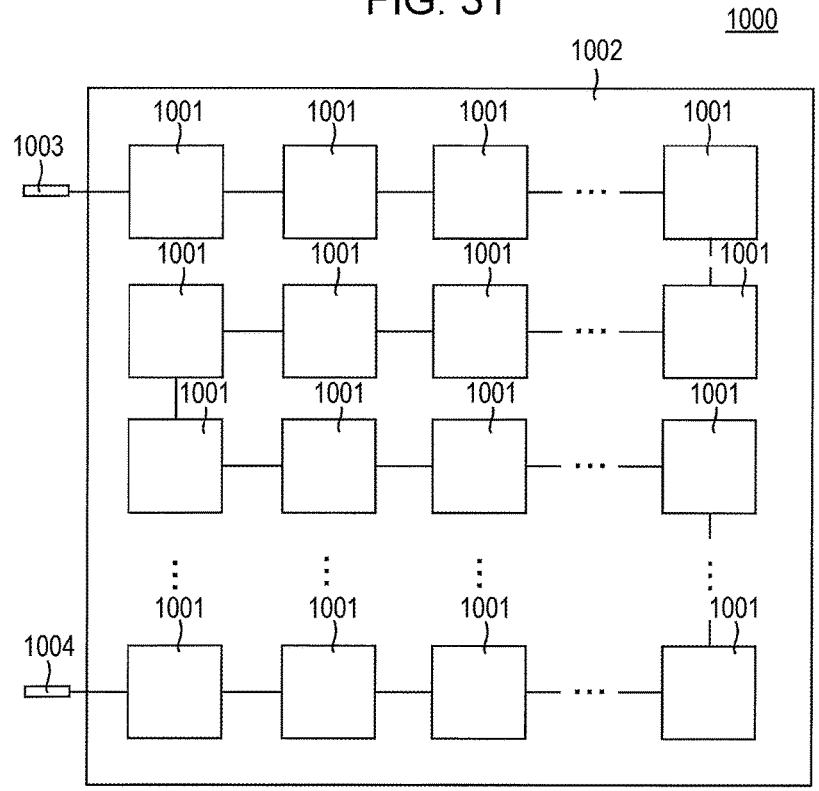
FIG. 31 is a schematic diagram illustrating a configuration of a photoelectric conversion module which includes the photoelectric conversion element according to this embodiment.

FIG. 31 is a schematic diagram illustrating a configuration of a photoelectric conversion module which includes the photoelectric conversion element according to the embodiment. With reference to FIG. 31, a photoelectric conversion module 1000 includes a plurality of photoelectric conversion elements 1001, a cover 1002, and output terminals 1003 and 1004.

The plurality of photoelectric conversion elements 1001 is arranged so as to have an array shape, and is connected to each other in series. The plurality of photoelectric conversion elements 1001 may be connected to each other in parallel, instead of connection in series. The plurality of photoelectric conversion elements 1001 may be connected to each other in a manner of combination of series connection and parallel connection.

Each of the plurality of photoelectric conversion elements 1001 is configured from any of the photoelectric conversion elements 100, 200, 300, 400, and 500.

The cover 1002 is configured from a weatherable cover, and covers the plurality of photoelectric conversion elements 1001.

The output terminal 1003 is connected to a photoelectric conversion element 1001 which is disposed at one end of the plurality of photoelectric conversion elements 1001 connected in series to each other.

The output terminal 1004 is connected to a photoelectric conversion element 1001 which is disposed at another end of the plurality of photoelectric conversion elements 1001 connected in series to each other.

As described above, the photoelectric conversion elements 100, 200, 300, 400, and 500 have high conversion efficiency.

Accordingly, it is possible to improve conversion efficiency of the photoelectric conversion module 1000.

The photoelectric conversion module according to Embodiment 8 is not limited to the configuration illustrated in FIG. 31. The photoelectric conversion module may have any configuration as long as any of the photoelectric conversion elements 100, 200, 300, 400, and 500 is used.

Embodiment 9

Figure 32:
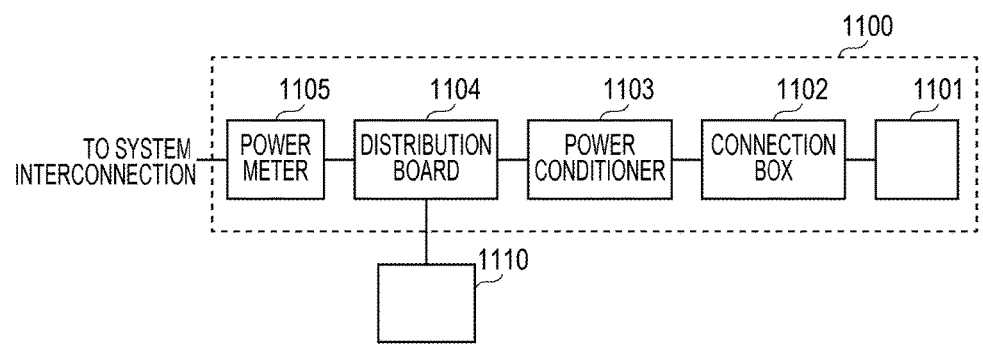
FIG. 32 is a schematic diagram illustrating a configuration of a photovoltaic power generation system which includes the photoelectric conversion element according to this embodiment.

FIG. 32 is a schematic diagram illustrating a configuration of a photovoltaic power generation system which includes the photoelectric conversion element according to the embodiment.

With reference to FIG. 32, a photovoltaic power generation system 1100 includes a photoelectric conversion module array 1101, a connection box 1102, a power conditioner 1103, a distribution board 1104, and a power meter 1105.

The connection box 1102 is connected to a photoelectric conversion module array 1101. The power conditioner 1103 is connected to the connection box 1102. The distribution board 1104 is connected to the power conditioner 1103 and the electrical equipment 1110. The power meter 1105 is connected to the distribution board 1104 and the system interconnection.

The photoelectric conversion module array 1101 converts light of the sun into electricity so as to generate DC power. The photoelectric conversion module array 1101 supplies the generated DC power to the connection box 1102.

The connection box 1102 receives DC power which has been generated by the photoelectric conversion module array 1101, and supplies the received DC power to the power conditioner 1103.

The power conditioner 1103 converts DC power received from the connection box 1102 into AC power. The power conditioner 1103 supplies the converted AC power to the distribution board 1104. The power conditioner 1103 may not convert a portion of the DC power received from the connection box 1102 into AC power, and may supply the DC power itself to the distribution board 1104.

The distribution board 1104 supplies the AC power received from the power conditioner 1103 and/or commercial power received through the power meter 1105, to the electrical equipment 1110. The distribution board 1104 supplies the remaining AC power to system interconnection through the power meter 1105, when the AC power received from the power conditioner 1103 is larger than consumed power of the electrical equipment 1110.

The power meter 1105 measures power in a direction from the system interconnection toward the distribution board 1104, and measures power from the distribution board 1104 toward the system interconnection.

Figure 33:
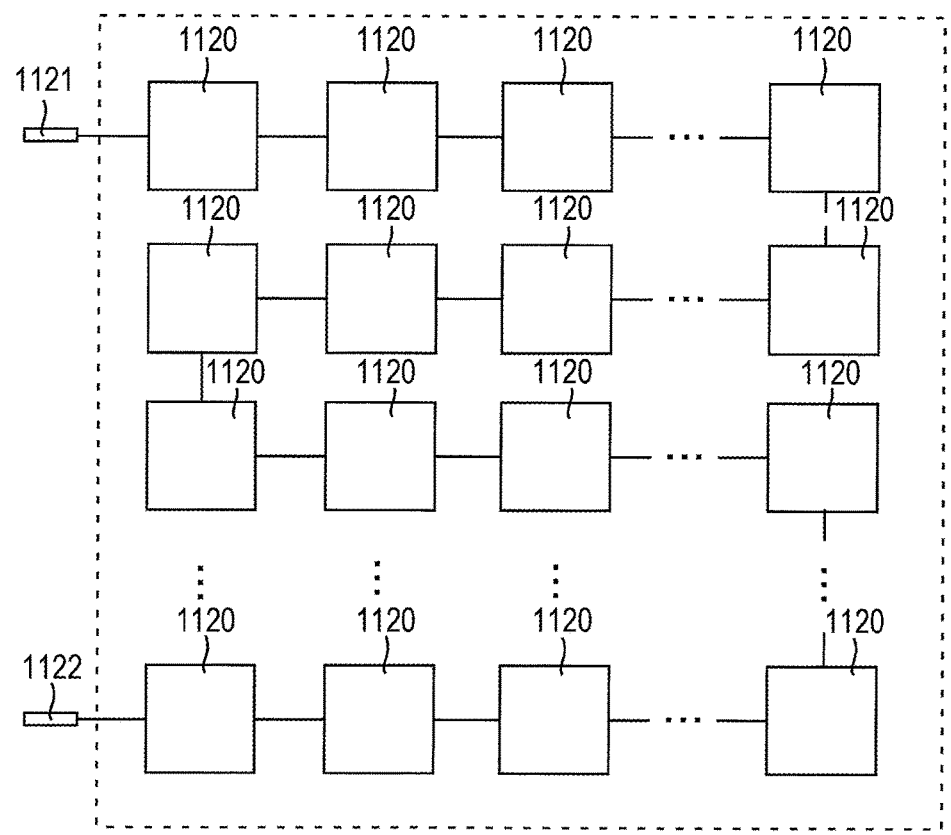
FIG. 33 is a schematic diagram illustrating a configuration of a photoelectric conversion module array illustrated in FIG. 32.

FIG. 33 is a schematic diagram illustrating a configuration of the photoelectric conversion module array 1101 illustrated in FIG. 32.

With reference to FIG. 33, the photoelectric conversion module array 1101 includes a plurality of photoelectric conversion modules 1120 and output terminals 1121 and 1122.

The plurality of photoelectric conversion modules 1120 is arranged so as to have an array shape, and is connected to each other in series. The plurality of photoelectric conversion modules 1120 may be connected to each other in parallel, instead of connection in series. The plurality of photoelectric conversion modules 1120 may be connected to each other in a manner of combination of series connection and parallel connection. Each of the plurality of photoelectric conversion modules 1120 is configured from the photoelectric conversion module 1000 illustrated in FIG. 31.

The output terminal 1121 is connected to a photoelectric conversion module 1120 positioned at one end of the plurality of photoelectric conversion modules 1120 which are connected in series to each other.

The output terminal 1122 is connected to a photoelectric conversion module 1120 positioned at another end of the plurality of photoelectric conversion modules 1120 which are connected in series to each other.

An operation of the photovoltaic power generation system 1100 will be described. The photoelectric conversion module array 1101 converts light of the sun into electricity so as to generate DC power. The photoelectric conversion module array 1101 supplies the generated DC power to the power conditioner 1103 through the connection box 1102.

The power conditioner 1103 converts DC power received from the photoelectric conversion module array 1101 into AC power. The power conditioner 1103 supplies the converted AC power to the distribution board 1104.

The distribution board 1104 supplies AC power received from the power conditioner 1103 to the electrical equipment 1110 when the AC power received from the power conditioner 1103 is equal to or greater than consumed power of the electrical equipment 1110. The distribution board 1104 supplies the remaining AC power to system interconnection through the power meter 1105.

The distribution board 1104 supplies AC power received from the system interconnection and AC power received from the power conditioner 1103 to the electrical equipment 1110 when AC power received from the power conditioner 1103 is smaller than the consumed power of the electrical equipment 1110.

As described above, the photovoltaic power generation system 1100 includes any of the photoelectric conversion elements 100, 200, 300, 400, and 500 which have high conversion efficiency.

Thus, it is possible to improve conversion efficiency of the photovoltaic power generation system 1100.

The photovoltaic power generation system according to Embodiment 9 is not limited to the configuration illustrated in FIGS. 32 and 33. The photovoltaic power generation system may have any configuration as long as any of the photoelectric conversion elements 100, 200, 300, 400, and 500 is used.

Embodiment 10

Figure 34:
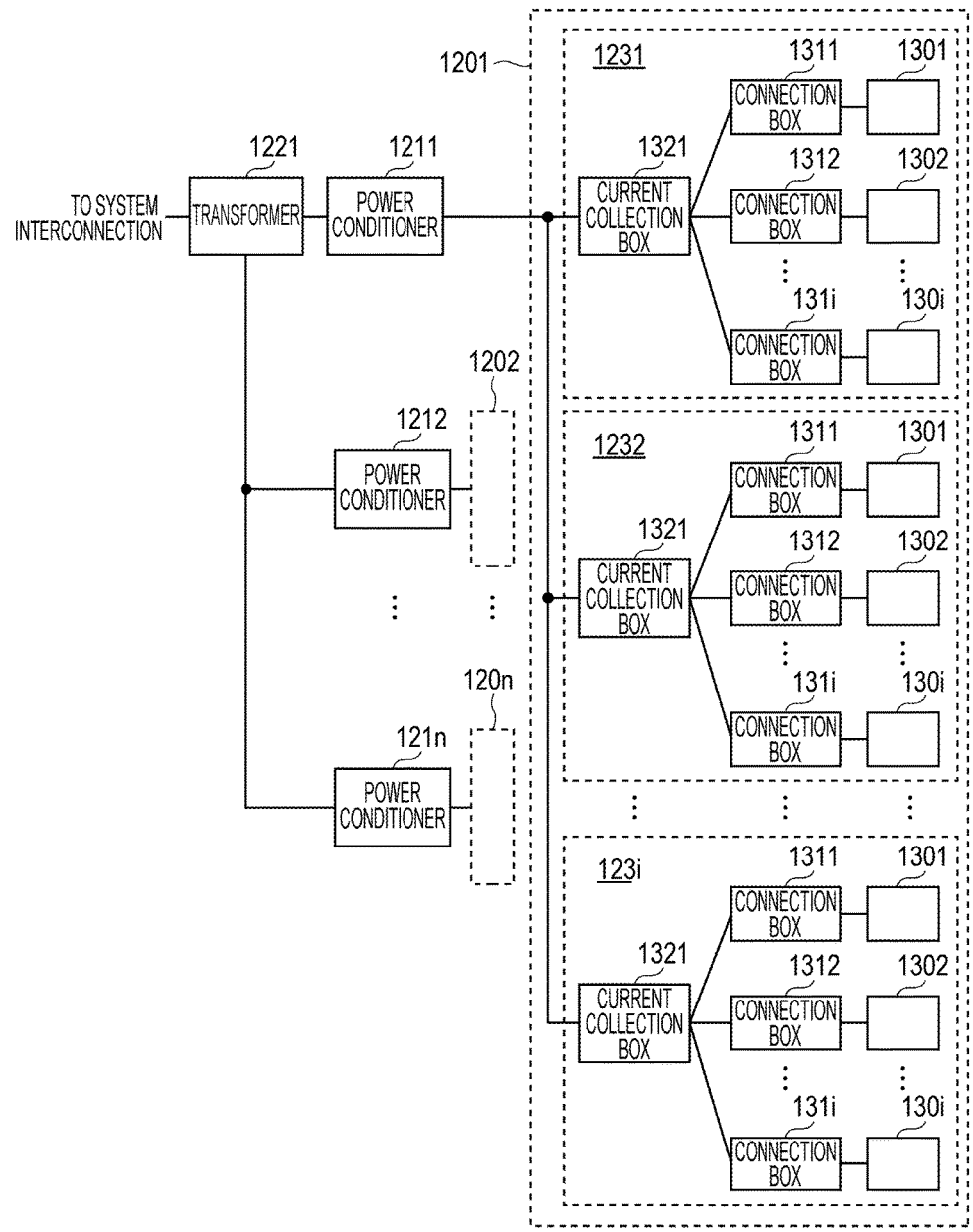
FIG. 34 is a schematic diagram illustrating a configuration of a photovoltaic power generation system which includes the photoelectric conversion element according to this embodiment.
Figure 35:
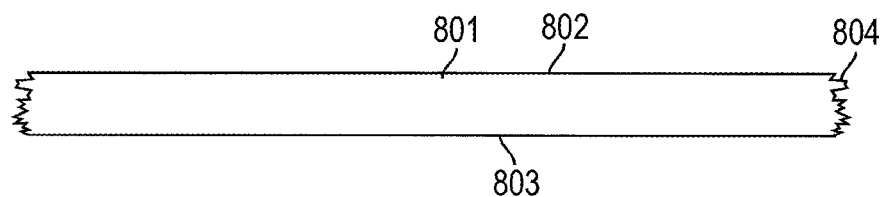
FIG. 35 is a sectional view of a solar cell using an n-type silicon substrate.

FIG. 34 is a schematic diagram illustrating a configuration of a photovoltaic power generation system which includes the photoelectric conversion element according to the embodiment.

With reference to FIG. 34, the photovoltaic power generation system 1200 includes subsystems 1201 to 120$n$ ($n$ is an integer of 2 or more), power conditioners 1211 to 121$n$, and a transformer 1221. The photovoltaic power generation system 1200 is a photovoltaic power generation system which has a size larger than the photovoltaic power generation system 1100 illustrated in FIG. 32.

The power conditioners 1211 to 121n are respectively connected to the subsystems 1201 to 120n.

The transformer 1221 is connected to the power conditioner 1211 to 121n, and the system interconnection.

Each of the subsystems 1201 to 120n is configured from module systems 1231 to 123j (j is an integer of 2 or more).

Each of the module systems 1231 to 123j includes photoelectric conversion module arrays 1301 to 130i (i is an integer of 2 or more), connection boxes 1311 to 131i, and a current collection box 1321.

Each of the photoelectric conversion module arrays 1301 to 130i has the same configuration as the photoelectric conversion module array 1101 illustrated in FIG. 33.

The connection boxes 1311 to 131i are respectively connected to the photoelectric conversion module arrays 1301 to 130i.

The current collection box 1321 is connected to the connection boxes 1311 to 131i. j pieces of current collection boxes 1321 in the subsystem 1201 are connected to the power conditioner 1211. j pieces of current collection boxes 1321 in the subsystem 1202 is connected to the power conditioner 1212. In the following descriptions, similarly, j pieces of current collection boxes 1321 in the subsystem 120n are connected to the power conditioner 121n.

i pieces of photoelectric conversion module arrays 1301 to 130i in the module system 1231 convert light of the sun into electricity so as to generate DC power. The photoelectric conversion module arrays 1301 to 130i supply the generated DC power to the current collection box 1321 through the connection boxes 1311 to 131i. i pieces of photoelectric conversion module arrays 1301 to 130i in the module system 1232 convert light of the sun into electricity so as to generate DC power. The photoelectric conversion module arrays 1301 to 130i supply the generated DC power to the current collection box 1321 through the connection boxes 1311 to 131i. In the following descriptions, similarly, i pieces of photoelectric conversion module arrays 1301 to 130i in the module system 123j convert light of the sun into electricity so as to generate DC power, and supplies the generated DC power to the current collection box 1321 through the connection box 1311 to 131i.

j pieces of current collection boxes 1321 in the subsystem 1201 supply DC power to the power conditioner 1211.

Similarly, j pieces of current collection boxes 1321 in the subsystem 1202 supply DC power to the power conditioner 1212.

In the following descriptions, similarly, j pieces of current collection boxes 1321 in the subsystem 120n supply DC power to the power conditioner 121n.

Each of the power conditioners 1211 to 121n converts DC power received from the subsystems 1201 to 120n into AC power, and supplies the generated AC power to the transformer 1221.

The transformer 1221 receives AC power from the power conditioners 1211 to 121n. The transformer 1221 converts a voltage level of the received AC power, and supplies power having the converted voltage level to the system interconnection.

As described above, the photovoltaic power generation system 1200 includes any of the photoelectric conversion elements 100, 200, 300, 400, and 500 which have high conversion efficiency.

Accordingly, it is possible to improve conversion efficiency of the photovoltaic power generation system 1200.

The photovoltaic power generation system according to Embodiment 10 is not limited to the configuration illustrated in FIG. 34. The photovoltaic power generation system may have any configuration as long as any of the photoelectric conversion elements 100, 200, 300, 400, and 500 is used.

In the above-described Embodiments 1, 2, and 4, a photoelectric conversion element in which electrodes are disposed on the light-receiving surface side and the back surface side is described. In Embodiments 3 and 5, a photoelectric conversion element in which electrodes are disposed on an opposite side of the light-receiving surface is described.

Accordingly, the photoelectric conversion elements according to the embodiments of the present invention may be photoelectric conversion elements including a silicon substrate. The silicon substrate may include a central region and an end-portion region which is disposed on an outside of the central region in an in-plane direction of the silicon substrate. The thickness of the end-portion region may be thinner than the thickness of the central region. The average surface roughness of the end-portion region may be smaller than the average surface roughness of the central region.

This is because, if a silicon substrate in which the thickness of the end-portion region is thinner than the thickness of the central region, and the average surface roughness of the end-portion region is smaller than the average surface roughness of the central region is provided, it is possible to reduce variation in in-surface distribution of the open-circuit voltage, and to improve conversion efficiency of the photoelectric conversion element.

The embodiments disclosed this time should be considered not to be restricted to all exemplified points. The scope of the present invention is presented by the claims, not the descriptions of the above embodiments. The equivalents to the scope of the claims, and all modifications within the scope are intended to cover the scope of the inventions.

INDUSTRIAL APPLICABILITY

The present invention is applied to a photoelectric conversion element and a solar cell module provided with the photoelectric conversion element.

The invention claimed is:
1. A photoelectric conversion element comprising:
a silicon substrate, the silicon substrate having four sides;
wherein
the silicon substrate includes a central region, and an end-portion region which is disposed on an outside of the central region of the silicon substrate in an in-plane direction,
the central region is a circular region concentric to the silicon substrate, a diameter of the central region is 40% of a length of a shortest side among the four sides of the silicon substrate,
the end-portion region is a region within 5 mm from an edge of the silicon substrate,
a thickness of the end-portion region is thinner than a thickness of the central region, and
average surface roughness of the end-portion region is smaller than average surface roughness of the central region.
2. The photoelectric conversion element according to claim 1, further comprising:

a first amorphous semiconductor layer which is disposed so as to be in contact with one surface of the silicon substrate and has substantially an i-conductive type;

a second amorphous semiconductor layer which is disposed so as to be in contact with the first amorphous semiconductor layer and has a first conductive type;

a third amorphous semiconductor layer which is disposed so as to be in contact with a surface on an opposite side of the one surface of the silicon substrate, and has substantially an i-conductive type; and a fourth amorphous semiconductor layer which is disposed so as to be in contact with the third amorphous semiconductor layer, and has a second conductive type which is opposite to the first conductive type.

3. The photoelectric conversion element according to claim 1, further comprising:

a first amorphous semiconductor layer which is disposed so as to be in contact with a light-receiving surface of the silicon substrate;

a second amorphous semiconductor layer which is disposed so as to be in contact with a surface of the silicon substrate on an opposite side of the light-receiving surface, and has substantially an i-conductive type;

a third amorphous semiconductor layer which is disposed so as to be in contact with the surface of the silicon substrate on the opposite side of the light-receiving surface and to be adjacent to the second amorphous semiconductor layer in the in-plane direction of the silicon substrate, and has substantially an i-conductive type;

a fourth amorphous semiconductor layer which is disposed so as to be in contact with the second amorphous semiconductor layer and has a conductive type which is opposite to a conductive type of the silicon substrate; and a fifth amorphous semiconductor layer which is disposed so as to be in contact with the third amorphous semiconductor layer and has the same conductive type as the conductive type of the silicon substrate.

4. The photoelectric conversion element according to claim 1, further comprising:

an antireflection coat which is disposed so as to be in contact with a light-receiving surface of the silicon substrate, wherein the silicon substrate includes a first diffusion layer which is disposed so as to be in contact with a surface on an opposite side of the light-receiving surface, and has a conductive type which is opposite to a conductive type of the silicon substrate, and a second diffusion layer which is disposed so as to be in contact with the surface on the opposite side of the light-receiving surface and to be adjacent to the first diffusion layer in the in-plane direction of the silicon substrate, and has the same conductive type as the conductive type of the silicon substrate.

5. The photoelectric conversion element according to claim 1, further comprising:

an antireflection coat which is disposed so as to be in contact with a light-receiving surface of the silicon substrate, wherein the silicon substrate includes a first diffusion layer which is disposed so as to be in contact with the light-receiving surface of the silicon substrate, and has the same conductive type as the conductive type of the silicon substrate, and a second diffusion layer which is disposed so as to be in contact with a surface of the silicon substrate on an opposite side of the light-receiving surface, and has a conductive type which is opposite to the conductive type of the silicon substrate.

6. A photoelectric conversion module comprising:
the photoelectric conversion element according to claim 1.

7. A photovoltaic power generation system comprising:
the photoelectric conversion module according to claim 6.

* * * * *